US010359490B2

(12) United States Patent
Kuhara

(10) Patent No.: US 10,359,490 B2
(45) Date of Patent: Jul. 23, 2019

(54) MAGNETIC RESONANCE IMAGING APPARATUS AND MAGNETIC RESONANCE IMAGING METHOD WITH CURVE FITTING EXPRESSION PROVIDING COMPENSATION FOR INVERSION RECOVERY, OR WITH CURVE FITTING EXPRESSION PROVIDING COMPENSATION FOR SATURATION

(71) Applicant: TOSHIBA MEDICAL SYSTEMS CORPORATION, Otawara-shi, Tochigi (JP)

(72) Inventor: Shigehide Kuhara, Tochigi (JP)

(73) Assignee: TOSHIBA MEDICAL SYSTEMS CORPORATION, Otawara-shi, Tochigi-Ken (JP)

( * ) Notice: Subject to any disclaimer, the term of this patent is extended or adjusted under 35 U.S.C. 154(b) by 1078 days.

(21) Appl. No.: 14/694,232

(22) Filed: Apr. 23, 2015

(65) Prior Publication Data
US 2015/0309143 A1 Oct. 29, 2015

(30) Foreign Application Priority Data
Apr. 24, 2014 (JP) .................................. 2014-89889

(51) Int. Cl.
*G01R 33/50* (2006.01)
(52) U.S. Cl.
CPC .................................. *G01R 33/50* (2013.01)
(58) Field of Classification Search
USPC .......................... 324/300–322; 600/407–435; 382/128–131
See application file for complete search history.

(56) References Cited

U.S. PATENT DOCUMENTS 8,581,583 B2 * 11/2013 Greiser .................. A61B 5/055
324/307
8,781,197 B2 * 7/2014 Wang ..................... G01R 33/54
382/131
(Continued)

FOREIGN PATENT DOCUMENTS

JP 2000-342550 12/2000
JP 2004-305759 11/2004
(Continued)

OTHER PUBLICATIONS

S. Kuhara et al., "Polarity-Corrected TI Prep Tool for Delayed-Enhancement MR Imaging and T1 Mapping", Proc. Intl. Soc. Mag. Reson. Med. 22, May 10, 2014, 1 page.
(Continued)

Primary Examiner — Melissa J Koval
Assistant Examiner — Tiffany A Fetzner
(74) Attorney, Agent, or Firm — Nixon & Vanderhye P.C.

(57) ABSTRACT

According to one embodiment, a magnetic resonance imaging apparatus includes a data acquiring part and a processing circuit. The data acquiring part is configured to acquire a magnetic resonance signal after applying an inversion recovery pulse or a saturation pulse. The processing circuit generates magnetic resonance examination data based on the magnetic resonance signal, by data processing including processing for compensating an incomplete inversion of a longitudinal magnetization resulting from an inversion efficiency of the inversion recovery pulse or processing for compensating an incomplete saturation of a longitudinal magnetization resulting from a saturation efficiency of the saturation pulse.

19 Claims, 14 Drawing Sheets

(56) References Cited

U.S. PATENT DOCUMENTS

| | | | |
|---|---|---|---|
| 8,848,990 B2* | 9/2014 | Xue | G06T 7/30 |
| | | | 382/128 |
| 9,594,138 B2 | 3/2017 | Kuhara | G01R 33/5602 |
| 10,175,325 B2* | 1/2019 | Kim | G01R 33/5601 |
| 2007/0088212 A1 | 4/2007 | Takei et al. | 600/413 |
| 2008/0150532 A1* | 6/2008 | Slavin | G01R 33/50 |
| | | | 324/318 |
| 2011/0044524 A1* | 2/2011 | Wang | G01R 33/54 |
| | | | 382/131 |
| 2011/0181285 A1* | 7/2011 | Greiser | A61B 5/055 |
| | | | 324/309 |
| 2012/0189183 A1* | 7/2012 | Xue | G06T 5/50 |
| | | | 382/131 |
| 2015/0223703 A1* | 8/2015 | Abd-Elmoniem | A61B 5/7207 |
| | | | 600/413 |
| 2015/0309141 A1* | 10/2015 | Kim | G01R 33/5601 |
| | | | 600/416 |
| 2015/0309143 A1* | 10/2015 | Kuhara | G01R 33/50 |
| | | | 324/309 |

FOREIGN PATENT DOCUMENTS

| | | |
|---|---|---|
| JP | 2006-149563 | 6/2006 |
| JP | 2007-111188 | 5/2007 |
| JP | 2012-110690 | 6/2012 |

OTHER PUBLICATIONS

First Japanese office action dated Nov. 6, 2018, in Patent Application No. JP 2015-61412.

* cited by examiner

MAGNETIC RESONANCE IMAGING APPARATUS AND MAGNETIC RESONANCE IMAGING METHOD WITH CURVE FITTING EXPRESSION PROVIDING COMPENSATION FOR INVERSION RECOVERY, OR WITH CURVE FITTING EXPRESSION PROVIDING COMPENSATION FOR SATURATION

CROSS REFERENCES TO RELATED APPLICATIONS

This application is based upon and claims the benefit of priority from Japanese Patent Application No. 2014-089889 filed on Apr. 24, 2014; the entire contents of which are incorporated herein by reference.

Further, the entire contents of Japanese Patent Application No. 2015-061412, filed on Mar. 24, 2015 are incorporated herein by reference.

FIELD

Embodiments described herein relate generally to an MRI (magnetic resonance imaging) apparatus and a magnetic resonance imaging method.

BACKGROUND

The MRI apparatus is an imaging diagnostic apparatus which magnetically excites nuclear spins of an object set in a static magnetic field with RF (radio frequency) signals having the Larmor frequency and reconstructs images based on MR (magnetic resonance) signals generated due to the excitation.

In recent years, usefulness of longitudinal relaxation time (T1) distribution images has been pointed out in an examination of the heart using an MRI apparatus. A T1 distribution image can be obtained by continuously acquiring time series MR signals from a region, which is a generation target of the T1 distribution image data, after applying an IR (inversion recovery) pulse in synchronization with an ECG (electro cardiogram) signal, as a distribution of time constants of recovery curves of MR signals, by the longitudinal relaxation (T1 relaxation), obtained at respective pixel positions based on the acquired time series MR signal train.

The T1 in a myocardial infarction part is shorter than the T1 in a normal myocardial tissue. Therefore, generating T1 distribution image data with a clear contrast allows expecting to use the T1 distribution image data for an identification of a myocardial infarction part.

An object of the present invention is to provide a magnetic resonance imaging apparatus and a magnetic resonance imaging method which can obtain useful information for an examination of a heart with a higher accuracy.

DETAILED DESCRIPTION

In general, according to one embodiment, a magnetic resonance imaging apparatus includes a static field magnet, a gradient coil, at least one radio frequency coil and a processing circuit. The static field magnet, the gradient coil, and the at least one radio frequency coil are configured to acquire a magnetic resonance signal after applying an inversion recovery pulse or a saturation pulse. The processing circuit generates magnetic resonance examination data based on the magnetic resonance signal, by data processing including processing for compensating an incomplete inversion of a longitudinal magnetization resulting from an inversion efficiency of the inversion recovery pulse or processing for compensating an incomplete saturation of a longitudinal magnetization resulting from a saturation efficiency of the saturation pulse.

Further, according to another embodiment, a magnetic resonance imaging apparatus includes a static field magnet, a gradient coil, at least one radio frequency coil and a processing circuit. The static field magnet, the gradient coil, and the at least one radio frequency coil are configured to perform a data acquisition multiple times. The data acquisition is for acquiring a magnetic resonance signal after applying an inversion recovery pulse or a saturation pulse in a synchronization with a biological signal. A period from an application timing of the inversion recovery pulse or the saturation pulse to an acquisition timing of the magnetic resonance signal varies. A variation in the period becomes longer when the period is longer. The processing circuit generates magnetic resonance examination data based on magnetic resonance signals acquired by performing the data acquisition multiple times.

Further, according to another embodiment, a magnetic resonance method includes acquiring a magnetic resonance signal after applying an inversion recovery pulse or a saturation pulse; and generating magnetic resonance examination data based on the magnetic resonance signal, by data processing including processing for compensating an incomplete inversion of a longitudinal magnetization resulting from an inversion efficiency of the inversion recovery pulse or processing for compensating an incomplete saturation of a longitudinal magnetization resulting from a saturation efficiency of the saturation pulse.

A magnetic resonance imaging apparatus and a magnetic resonance imaging method according to embodiments of the present invention will be described with reference to the accompanying drawings.

Figure 1:
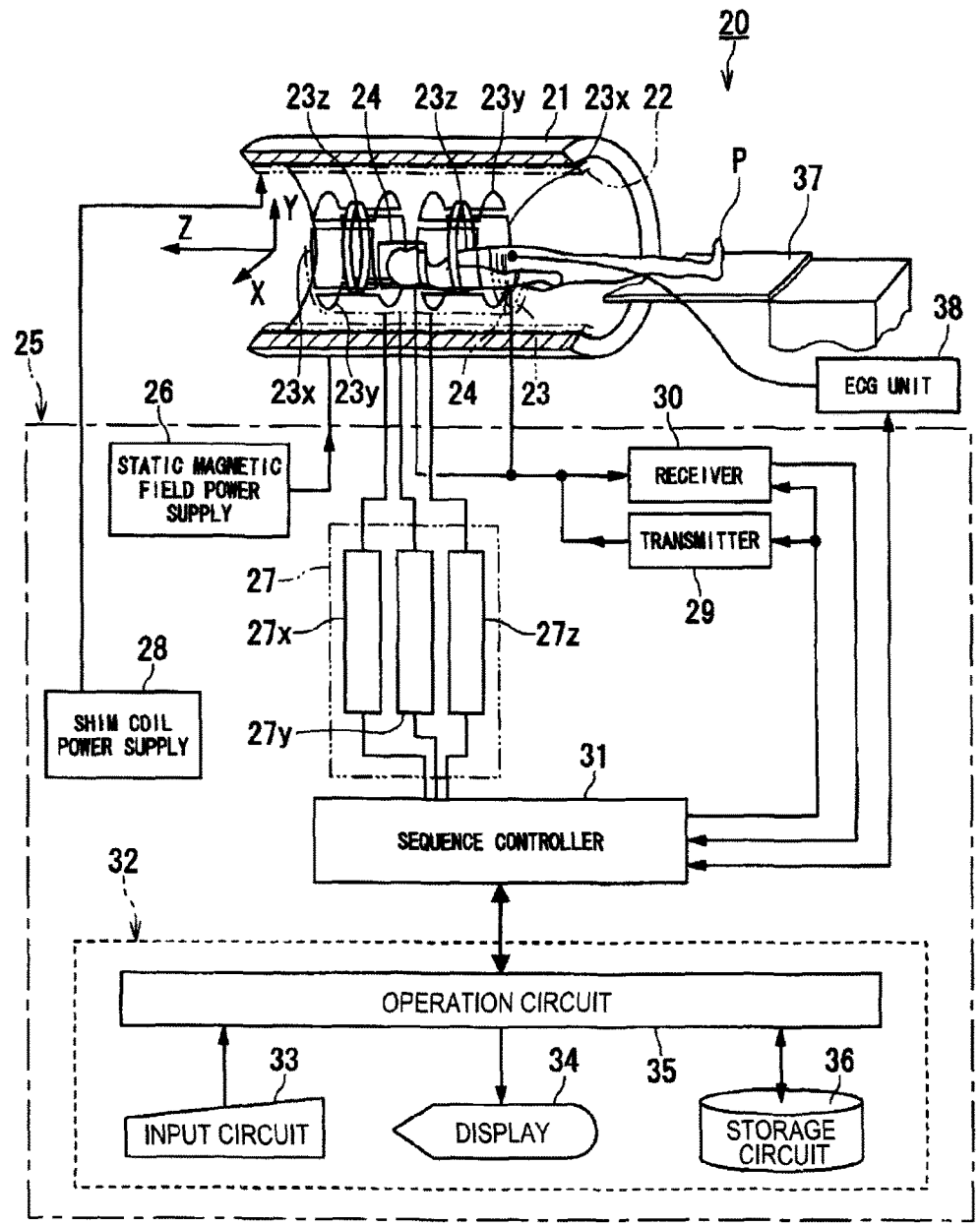
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input circuit 33, a display 34, an operation circuit 35 and a storage circuit 36. Examples of the input circuit 33 include a mouse, a keyboard, a trackball, a touch panel and a touch pad.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 31 stores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D (analog to digital) conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

In addition, an ECG unit 38 for acquiring an ECG signal of the object P is provided to the magnetic resonance imaging apparatus 20. The ECG signal detected by the ECG unit 38 is output to the computer 32 through the sequence controller 31.

Instead of using the ECG signal indicating object's heartbeats which serves as the heart rate information, it is possible to detect a peripheral pulse gating (PPG) signal also indicating object's heartbeats which serves as the pulse wave information. The PPG signal is detected from, for example, from a fingertip as an optical signal corresponding to the pulse wave appearing in the fingertip. To acquire this PPG signal, a PPG signal detection unit is used.

A biological signal, such as an ECG signal and a PPG signal, is used as a synchronization signal for synchronous imaging. Therefore, a biological signal, such as a respiratory synchronization signal or a phonocardiogram signal, other than an ECG signal or a PPG signal may be used as a synchronization signal as long as the biological signal can be used as the synchronization signal. Hereinafter, a case of acquiring an ECG signal as a synchronization signal will be described.

The computer 32 has various functions by the operation circuit 35 executing programs stored in the storage circuit 36 of the computer 32. Alternatively, specific circuits having various functions may be provided to the magnetic resonance imaging apparatus 20, instead of at least a part of the computer programs.

Figure 2:
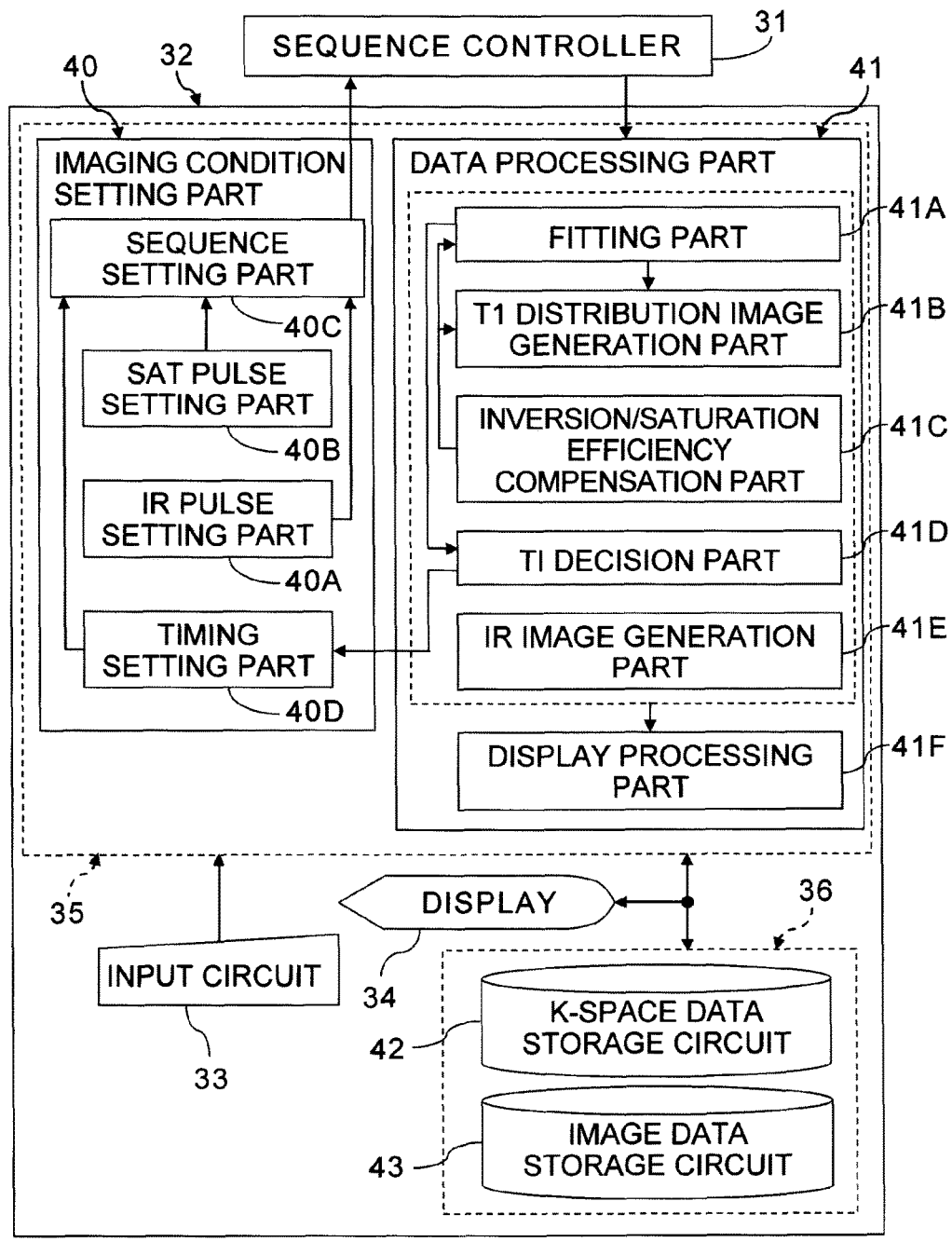
FIG. 2 is a functional block diagram of the computer shown in FIG. 1.

FIG. 2 is a functional block diagram of the computer 32 shown in FIG. 1.

The operation circuit 35 of the computer 32 functions as an imaging condition setting part 40 and a data processing part 41 by executing programs stored in the storage circuit 36. The storage circuit 36 functions as a k-space data storage circuit 42 and an image data storage circuit 43. The imaging condition setting part 40 has an IR pulse setting part 40A, a SAT (saturation) pulse setting part 40B, a sequence setting part 40C and a timing setting part 40D. The data processing part 41 has a fitting part 41A, a T1 distribution image generation part 41B, an inversion/saturation efficiency compensation part 41C, a TI (inversion time) decision part 41D, an IR image generation part 41E and a display processing part 41F. Note that, the computer 32 is also composed by electronic circuits. Therefore, it can be said that the imaging condition setting part 40 and the data processing part 41 can consist of at least one circuit, assuming that the computer 32 is a type of circuit. That is, the imaging condition setting part 40 and the data processing part 41 may be configured by a processing circuit consisting of a single circuit or plural circuits. The processing circuit may be at least one CPU (central processing unit), at least one GPU (graphics processing unit), at least one ASIC (application specific integrated circuit), and/or at least one PLD (programmable logic device), such as an SPLD (simple PLD), a CPLD (complex PLD) and a FPGA (field programmable gate array).

The imaging condition setting part 40 has a function to set imaging conditions including a pulse sequence and output the set imaging conditions to the sequence controller 31. Especially, the imaging condition setting part 40 has a function to set data acquiring conditions which acquire MR signals for generating MR examination data, such as T1 data, T1 distribution image data and MR morphological image data, in a region including a heart with an ECG synchronization. The data acquiring conditions for generating MR examination data are preferable to be conditions which repeat acquiring MR signals with an application of a prepulse, such as an IR pulse or a SAT pulse, using a reference wave, such as an R-wave of an ECG signal, as a trigger.

Therefore, the imaging condition setting part 40 includes the IR pulse setting part 40A, which sets application of IR pulses, the SAT pulse setting part 40B, which sets application of SAT pulses, the sequence setting part 40C, which set a pulse sequence with application of prepulses, such as IR pulses or SAT pulses, and the timing setting part 40D.

The timing setting part 40D has a function to set an application timing of each prepulse and an acquisition timing of MR signals. The application timing of each prepulse and the acquisition timing of MR signals can be set as a period (delay time) from a trigger of ECG synchronization to the application timing of the prepulse and a period from the application timing of the prepulse to the acquisition timing of the MR signals, respectively.

Hereinafter, a reference wave of an ECG signal used as a trigger of ECG synchronization will be described as an R-wave. Obviously, another reference wave, such as a P-wave, may also be used as a trigger.

Figure 3:
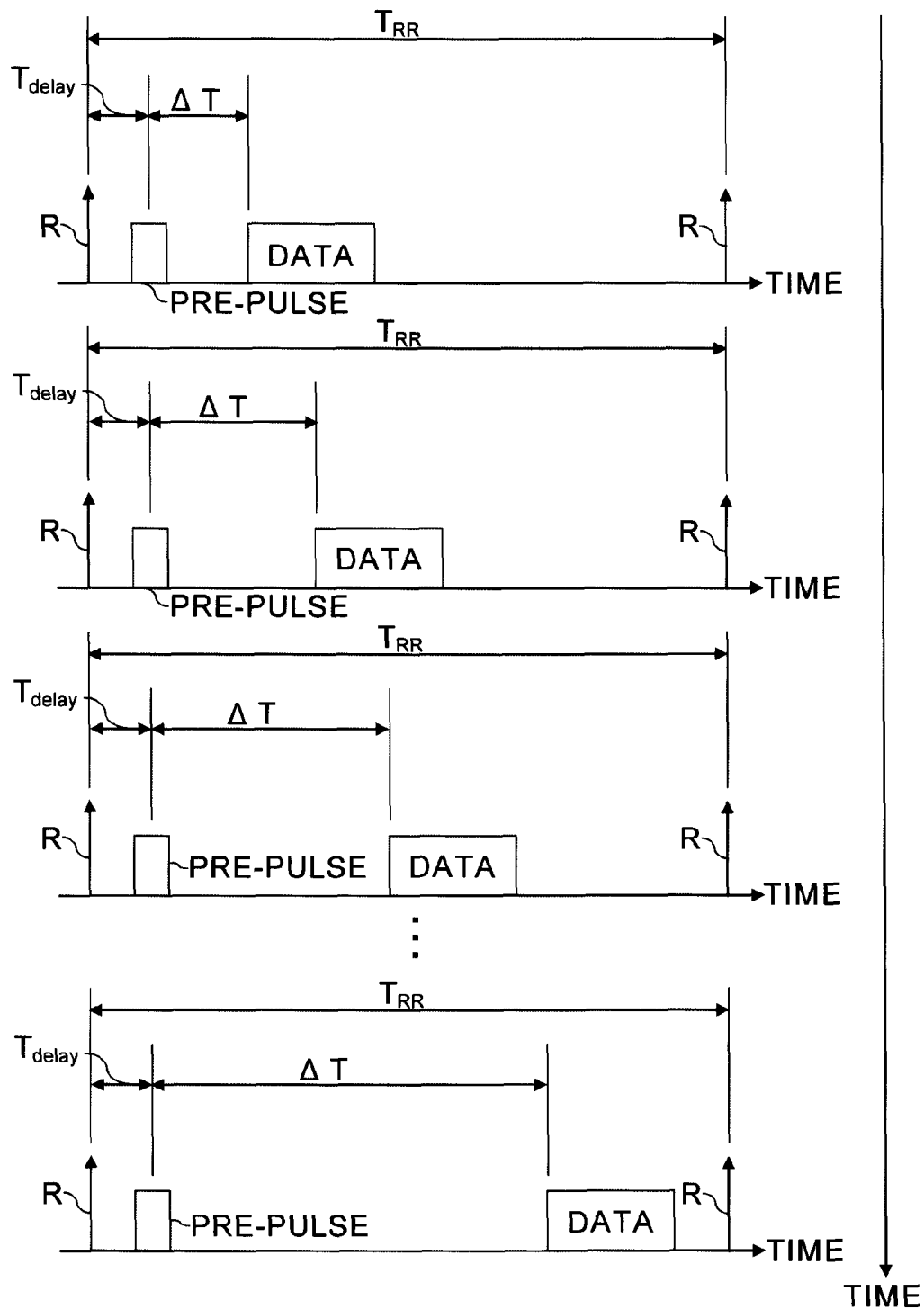
FIG. 3 is a sequence chart showing the first imaging conditions for acquiring T1 distribution image data.

FIG. 3 is a sequence chart showing the first imaging conditions for acquiring T1 distribution image data.

In FIG. 3, each horizontal axis and the vertical axis direction show time. As shown in FIG. 3, it is possible to set data acquiring conditions for performing a data acquisition, which acquires MR signals after applying a prepulse, such as an IR pulse or a SAT pulse, in synchronization with an R-wave of an ECG signal, multiple times with changing a period $\Delta T$ from an application timing of the prepulse to an acquisition timing of the MR signals.

In an example shown in FIG. 3, each time an R-wave is detected from an ECG signal, a prepulse is applied after a certain delay time $T_{delay}$ from the R-wave. Therefore, a prepulse is applied once in an interval $T_{RR}$ between adjacent R-waves. Then, MR signals are repeatedly acquired with changing a period $\Delta T$ from an application timing of a prepulse to an acquisition timing of MR signals.

In an example shown in FIG. 3, all MR signals from a necessary region which should be filled up into a k-space are acquired after an application of one prepulse, that is, in the interval $T_{RR}$ between adjacent R-waves. However, the k-space may be divided into segments so that the MR signals can be acquired for each segment. A data acquisition method which acquires MR signals with dividing a k-space into segments is called segmented k-space method.

When MR signals are acquired by the segmented k-space method, the period $\Delta T$ from an application timing of a prepulse to an acquisition timing of MR signals is set constant until acquiring MR signals from all segments is completed. That is, MR signals are acquired sequentially from segments by setting the period $\Delta T$ from an application timing of a prepulse to an acquisition timing of MR signals constant. After acquiring MR signals from all segments, the period $\Delta T$ from an application timing of a prepulse to an acquisition timing of MR signals is changed, and MR signals are reacquired sequentially from the segments.

When MR signals are acquired under the data acquiring conditions shown in FIG. 3, k-spaces corresponding to the periods $\Delta T$ different from each other are filled up with the MR signals, respectively. Then, k-space data sets corresponding to the periods $\Delta T$ can be used as original data for generating T1 distribution image data.

Figure 4:
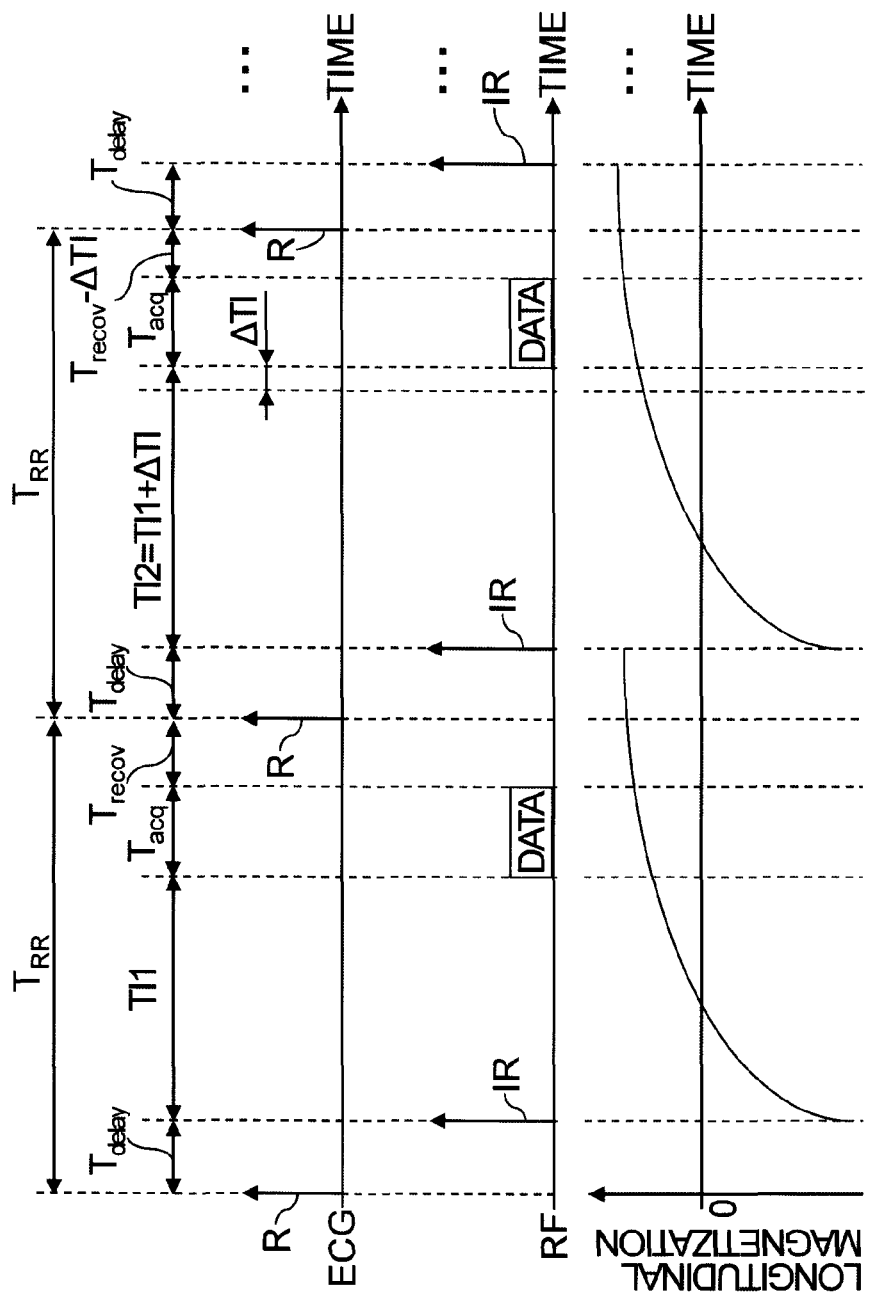
FIG. 4 is a sequence chart showing an example of using an IR pulse as the prepulse shown in FIG. 3.

FIG. 4 is a sequence chart showing an example of using an IR pulse as the prepulse shown in FIG. 3.

In FIG. 4, each horizontal axis shows time, ECG shows detection timing of each R-wave of an ECG signal, RF shows application timing of each IR pulse and data acquisition timings of MR signals, and the lowermost graph shows a time change of the longitudinal magnetization, respectively.

As shown in FIG. 4, it is possible to set data acquiring conditions which applies IR pulses after a certain delay time $T_{delay}$ from time series R-waves which are repeatedly detected. When an IR pulse is applied, the longitudinal magnetization inverts by 180 degrees and becomes the negative minimum value. Furthermore, plural TIs of the IR pulses can be set as different values among different intervals $T_{RR}$ between R-waves. For example, sequentially adding a TI variation $\Delta TI$ to an TI initial value TI1 of the IR pulses can regularly change the TI into TI2, TI3, TI4, . . . . When a TI (=TI1, TI2, TI3, . . . ) has elapsed since application timing of each IR pulse, a data acquisition of MR signals is performed during a period $T_{acq}$.

Therefore, MR signals are acquired at timing when the longitudinal magnetization has recovered according to a value of TI. That is, MR signals having intensities according to a setting value of TI are acquired sequentially. Then, the longitudinal magnetization further recovers during a period $T_{recov}$ from after the data acquisition of MR signals to the following R-wave. When the following R-wave is detected, a similar data acquisition of MR signals with an application of an IR pulse is performed again with a different TI. Therefore, the longitudinal magnetization repeats an inversion and a recovery.

Figure 5:
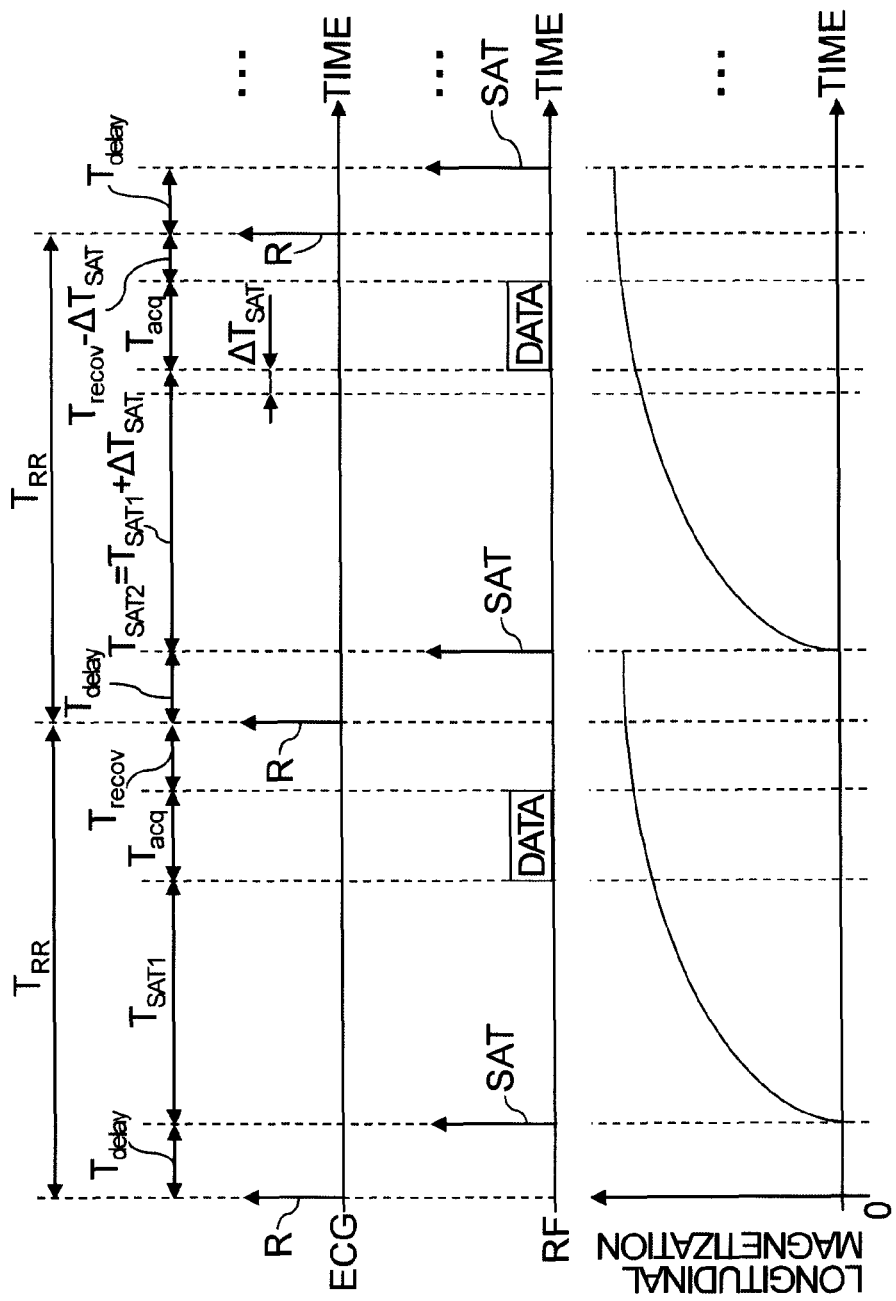
FIG. 5 is a sequence chart showing an example of using a SAT pulse as the prepulse shown in FIG. 3.

FIG. 5 is a sequence chart showing an example of using a SAT pulse as the prepulse shown in FIG. 3.

In FIG. 5, each horizontal axis shows time, ECG shows detection timing of each R-wave of an ECG signal, RF shows application timing of each SAT pulse and data acquisition timings of MR signals, and the lowermost graph shows a time change of the longitudinal magnetization, respectively.

As shown in FIG. 5, when a SAT pulse is used as a prepulse, data acquiring conditions can be set similarly to those corresponding to an IR pulse. Specifically, data acquiring conditions which applies a SAT pulse after a constant delay time $T_{delay}$ from a detection timing of an R-wave can be set. When a SAT pulse is applied, the longitudinal magnetization becomes zero. Furthermore, periods $T_{SAT}$ from application timings of SAT pulses to data acquisition timings of MR signals can be set as different values among different intervals $T_{RR}$ between R-waves. For example, a period $T_{SAT}$ can also be changed regularly into $T_{SAT2}$, $T_{SAT3}$, $T_{SAT4}$, . . . by sequentially adding an variation $\Delta T_{SAT}$ of the period $T_{SAT}$ to an initial value $T_{SAT1}$ of the period $T_{SAT}$.

However, when the delay time $T_{delay}$ of application timing of a prepulse, such as an IR pulse or a SAT pulse, from an R-wave is constant and the period $\Delta T$ from the application timing of the prepulse to the acquisition timing of MR signals is changed, a period from an R-wave to the data acquisition timing of the MR signals changes. Therefore, a cardiac time phase at the data acquisition timing of MR signals also changes. Consequently, the MR signals are acquired at states between which a form of the heart strictly differs.

On the other hand, it is ideal to calculate each T1 value, which is a pixel value of T1 distribution image data, based on an intensity change of signals at positions on the myocardium which can be considered to be same, from a viewpoint of improving accuracy. Thus, MR signals can be acquired at predetermined cardiac time phases, which can be considered to be same, by changing the delay time $T_{delay}$ from an R-wave of an ECG signal to an IR pulse or a SAT pulse, for each data acquisition in the interval $T_{RR}$ between R-waves.

Figure 6:
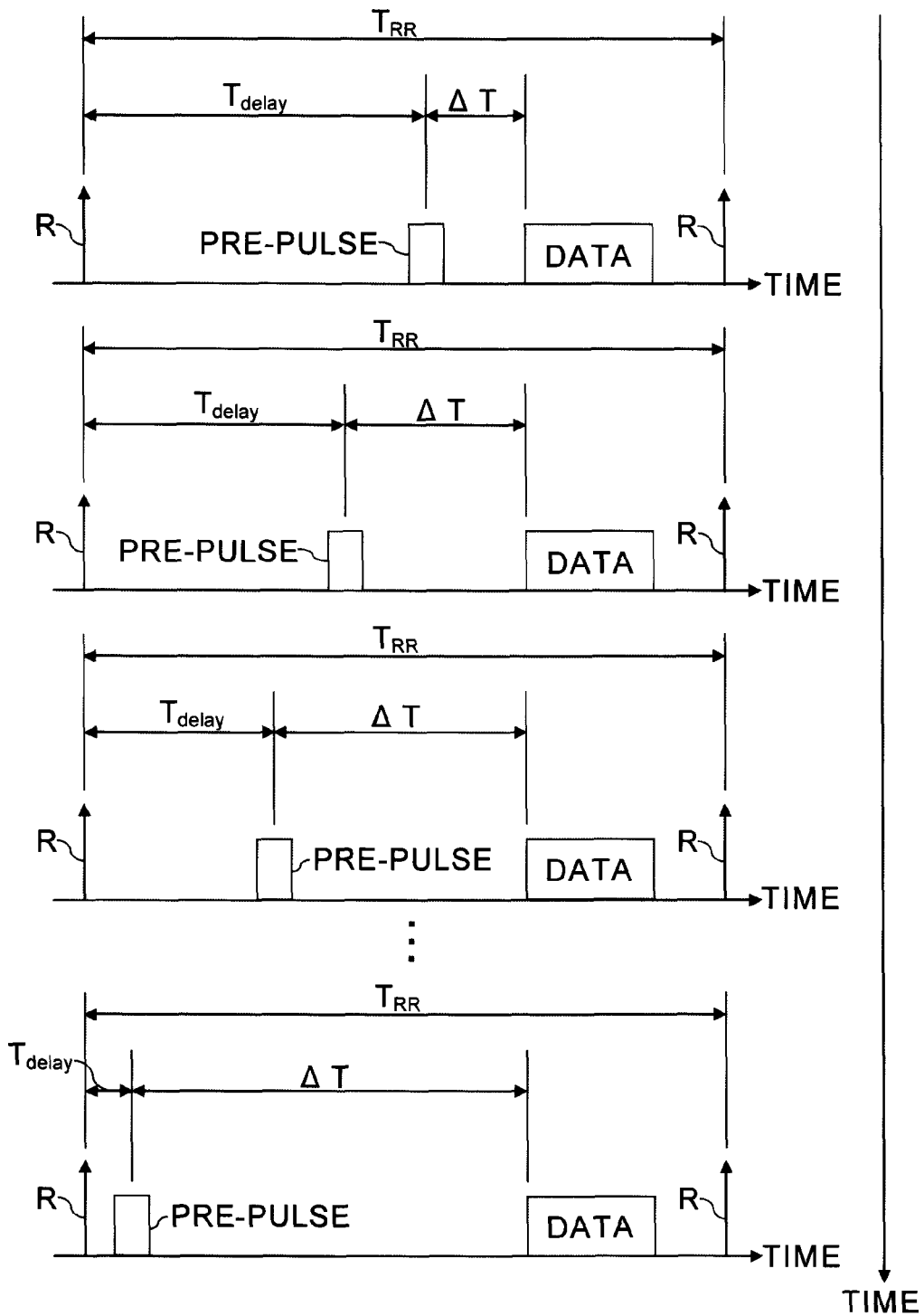
FIG. 6 is a sequence chart showing the second imaging conditions for acquiring T1 distribution image data.

FIG. 6 is a sequence chart showing the second imaging conditions for acquiring T1 distribution image data.

In FIG. 6, each horizontal axis and the vertical axis direction show time. As shown in FIG. 6, it is possible to set data acquiring conditions for performing a data acquisition which acquires MR signals after applying a prepulse, such as an IR pulse or a SAT pulse, in synchronization with an R-wave of an ECG signal, multiple times with changing a period $\Delta T$ from application timing of the prepulse to acquisition timing of the MR signals.

However, differently from an example shown in FIG. 3, the delay times $T_{delay}$ from R-waves to the IR pulses or the SAT pulses can be set as different values among the different intervals $T_{RR}$ between the R-waves. Then, even when the period $\Delta T$ from the application timing of the prepulse to the data acquisition timing of the MR signals is changed, the periods from the R-waves to the data acquisition timings of MR signals can be constant. Consequently, cardiac time phases at the acquisition timings of MR signals becomes nearly a same cardiac time phase, which allows acquiring MR signals at positions on the myocardium which can be considered to be same. Thereby, it becomes possible to calculate a T1 value at each spatial position in satisfactory accuracy.

Figure 7:
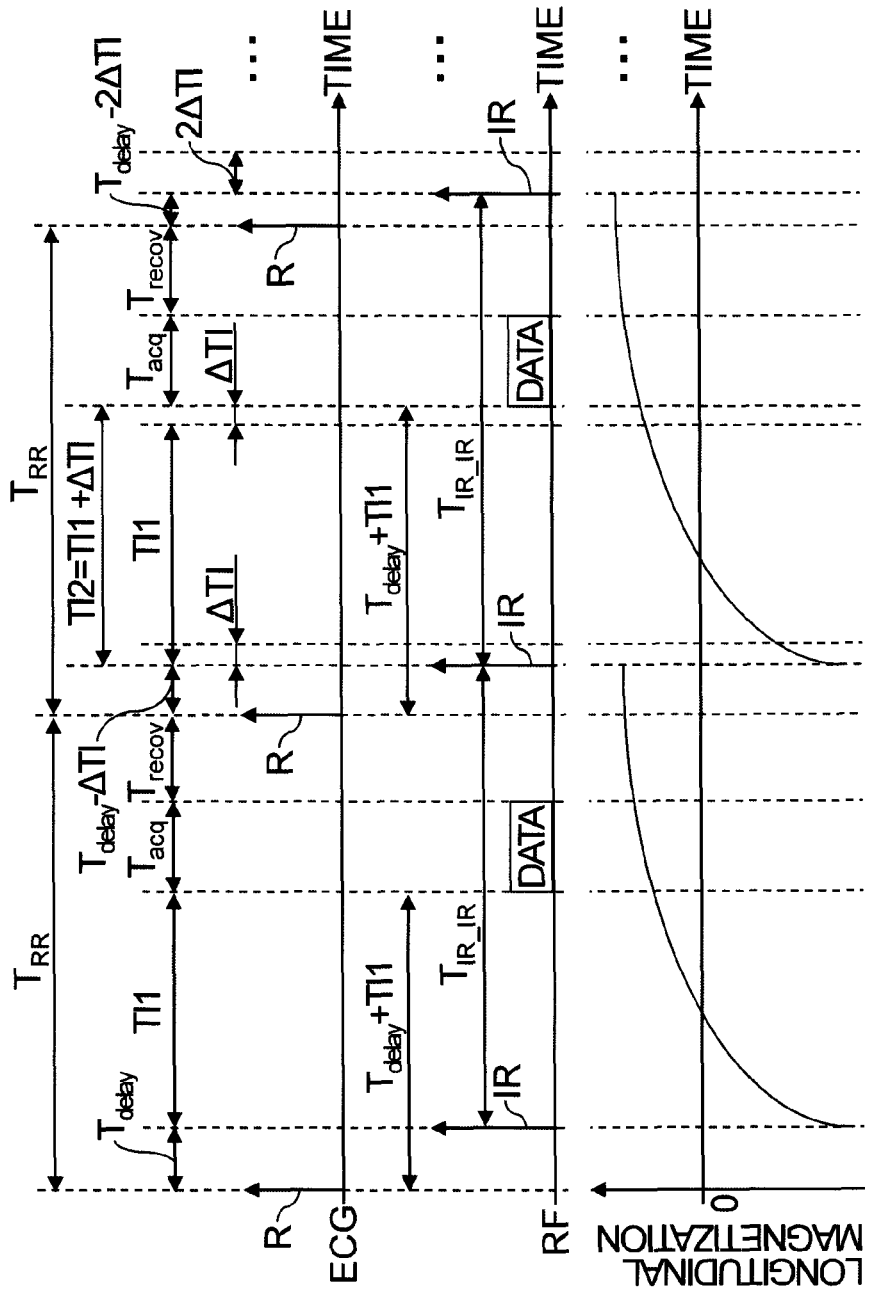
FIG. 7 is a sequence chart showing an example of using an IR pulse as the prepulse shown in FIG. 6.

FIG. 7 is a sequence chart showing an example of using an IR pulse as the prepulse shown in FIG. 6.

In FIG. 7, each horizontal axis shows time, ECG shows detection timing of each R-wave of an ECG signal, RF shows application timing of each IR pulse and data acquisition timings of MR signals, and the lowermost graph shows a time change of the longitudinal magnetization, respectively.

As shown in FIG. 7, an IR pulse can be used as a prepulse. Similarly to the example shown in FIG. 4, a TI of the IR pulse can be changed regularly into TI2, TI3, TI4, . . . by sequentially adding a variation $\Delta$TI of the TI to an initial value TI1 of the TI. In this case, delay times from the R-waves to the application timings of the IR pulses have only to be periods derived by sequentially subtracting the variation $\Delta$TI of the TI from an initial value $T_{delay}$ of the delay time. That is, the delay time have only to be a period derived by subtracting the variation to the initial value of TI, from the initial value $T_{delay}$ of the delay time.

By the above-mentioned setting of application timings of IR pulses and data acquisition timings of MR signals, each period from an R-wave to data acquisition timing of MR signals can be fixed to a sum of the initial value $T_{delay}$ of the delay time and the initial value TI1 of the TI. That is, respective MR signals can be acquired at a same cardiac time phase.

Other conditions shown in FIG. 7 are similar to the conditions shown in FIG. 4. Note that, intervals $T_{IR\_IR}$ between adjacent IR pulses are constant.

Figure 8:
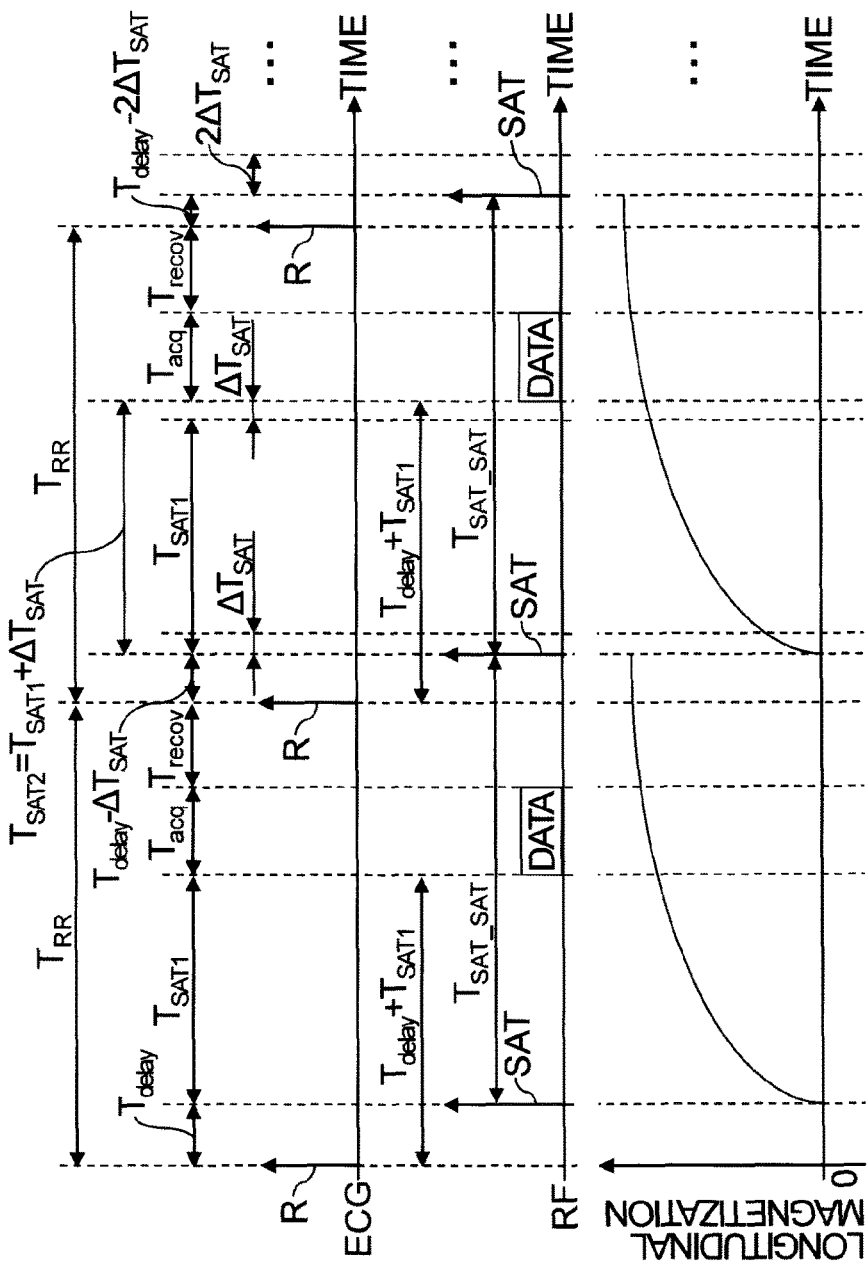
FIG. 8 is a sequence chart showing an example of using a SAT pulse as the prepulse shown in FIG. 6.

FIG. 8 is a sequence chart showing an example of using a SAT pulse as the prepulse shown in FIG. 6.

In FIG. 8, each horizontal axis shows time, ECG shows detection timing of each R-wave of an ECG signal, RF shows application timing of each SAT pulse and data acquisition timings of MR signals, and the lowermost graph shows a time change of the longitudinal magnetization, respectively.

As shown in FIG. 8, when a SAT pulse is used as a prepulse, data acquiring conditions can be set similarly to a case using an IR pulse. Specifically, it is possible to set data acquiring conditions, which applies a SAT pulse after a delay time from an R-wave and is adjusted so that a variation from an initial value $T_{SAT1}$, of a period $T_{SAT}$ from application timing of a SAT pulse to data acquisition timing of MR signals is canceled.

By the above-mentioned setting of application timings of IR pulses and data acquisition timings of MR signals, each period from an R-wave to data acquisition timing of MR signals can be fixed to a sum of the initial value $T_{delay}$ of the delay time and the initial value $T_{SAT1}$ of the period $T_{SAT}$. That is, respective MR signals can be acquired at a same cardiac time phase.

Other conditions shown in FIG. 8 are similar to the conditions shown in FIG. 5. Note that, intervals $T_{SAT\_SAT}$ between adjacent SAT pulses are constant.

As mentioned above, the magnetic resonance imaging apparatus 20 has a function as a data acquisition part, configured to acquire MR signals from the object P after applying IR pulses or SAT pulses according to desired data acquiring conditions, by the imaging condition setting part 40 of the computer 32 cooperating with hardware including the static field magnet 21, the shim coil 22, the gradient coil 23, and the RF coils 24. For example, MR signals for generating MR examination data, such as T1 data, T1 distribution image data and MR morphological image data can be acquired by applying an IR pulse or a SAT pulse multiple times with changing a period, such as a TI, as mentioned above. Alternatively, MR signals for blood flow imaging of the heart by the IR method can also be acquired by applying an IR pulse with a certain TI. However, the data acquisition part may be configured by other elements so long as similar functions as the data acquisition part are provided in the magnetic resonance imaging apparatus 20.

Next, functions of the data processing part 41 will be described.

The data processing part 41 has several functions. One function is to obtain MR data output from the sequence controller 31 to map the obtained MR data, as k-space data, in the k-space produced in the k-space data storage circuit 42. Other functions are to apply data processing, such as image reconstruction processing, including an FT (Fourier transform), and image processing, with the acquired data in order to produce various image data, to write the produced image data into the image data storage circuit 43 and to display image data, read from the image data storage circuit 43, on the display 34.

Especially, the data processing part 41 has a function to generate T1 data as MR examination data by obtaining a time constant of at least one curve obtained by curve fitting based on MR signals or image signals corresponding to the MR signals acquired by performing a data acquisition of MR signals, with an application of a prepulse in synchronization with an ECG signal, multiple times. Especially, when T1 data are obtained for each pixel position, T1 distribution image data can be generated as MR examination data. Furthermore, the data processing part 41 has a function to determine an appropriate TI for blood flow imaging of the heart by the IR method, based on at least one curve obtained by the curve fitting.

The fitting part 41A has a function to obtain an expression of at least one curve, approximating a change in the time phase direction of MR signals or image signals, by curve fitting based on the MR signals or the image signals. Specifically, the curve fitting can be performed using MR signals or frames of MR image data in the time phase direction, acquired with applications of IR pulses or SAT pulses.

When target data of the curve fitting is MR image data, MR image data are reconstructed by image reconstruction processing including an FT, for each elapsed time from application timing of an IR pulse or a SAT pulse to acquisition timing of MR signals. Accordingly, time series frames of MR image data corresponding to the different elapsed times from application timings of the IR pulses or the SAT pulses to acquisition timings of MR signals are generated. Then, the curve fitting can be performed using image signals at all pixel positions of the time series frames of MR image data. Alternatively, a desired cross-sectional region of the myocardium or the like can be set as an ROI (region of interest). Then, the curve fitting can be performed using image signals at pixel positions in the ROI of the time series frames of MR image data.

An ROI which is a target region of the curve fitting can be set manually or automatically using arbitrary one frame or frames of MR image data, selected out of time series frames of MR image data, as reference image data. When an ROI to be a target region of the curve fitting is set manually, the ROI can be set by displaying arbitrary one frame of MR image on the display 34 as a reference image and designating a range by an operation of the input circuit 33. Meanwhile, when an ROI to be a target region of the curve fitting is set automatically, a diagnostic target region, such as a region occupied by the myocardium, can be automatically set as a 2D (two dimensional) or 3D (three dimensional) ROI by known contour extraction processing, including threshold processing of pixel values of arbitrary one frame or frames of MR image data or the like.

Figure 9:
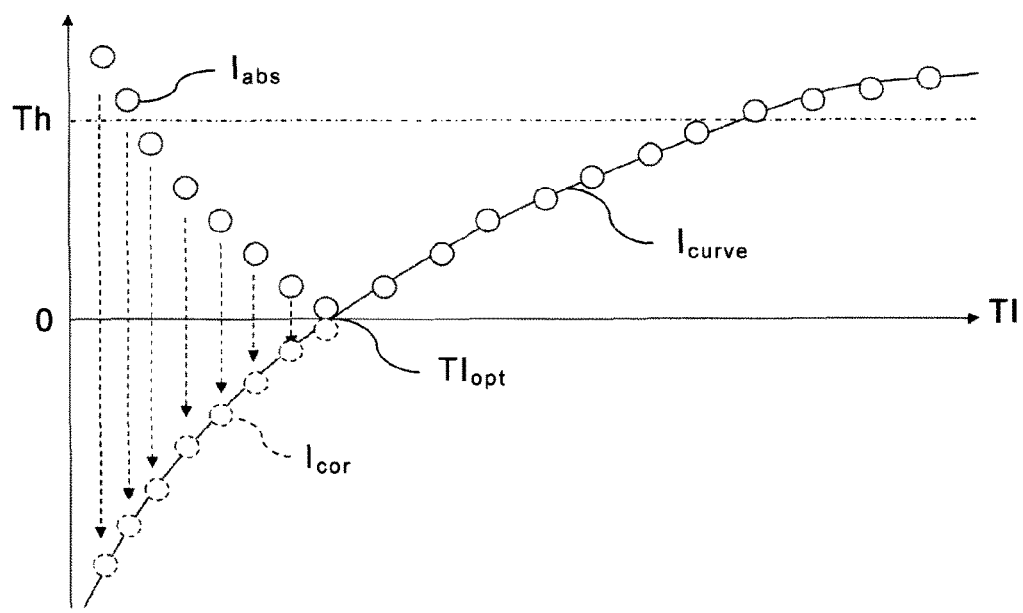
FIG. 9 shows an example of curve obtained by curve fitting.

FIG. 9 shows an example of curve obtained by curve fitting.

In FIG. 9, the vertical axis shows intensities of image signals and the horizontal axis shows TIs of IR pulses applied for acquiring the image signals. Discrete plotted data $I_{abs}$ as shown by solid line markings are obtained by plotting intensities of image signals, of frames of image data acquired by repeatedly applying an IR pulse intermittently with changing a TI in synchronization with an ECG signal, for each pixel position.

In the IR imaging, absolute values of complex image signals each consisting of a real part and an imaginary part are usually used as image data for display. Additionally, MR signals used for producing image signals have intensities which change depending on the longitudinal magnetization recovering through the T1 relaxation after application of a 180-degree IR pulse. As a result, plot data $I_{abs}$, which are absolute values of the image signals, are plotted along a curve which is similar to a discrete curve indicating absolute values of a recovery curve of the longitudinal magnetization. The plot data $I_{abs}$ of the image signals are shown as in FIG. 9, where the plot data presents the positive minimum value at a certain TI and also presents values which become larger as the TI becomes smaller and larger from the certain TI.

Therefore, in order to obtain a continuous image signal recovery curve $I_{curve}$, along with a recovery curve of the longitudinal magnetization as shown by the solid line, by curve fitting, image signals inverted onto the positive side by calculating the absolute values thereof must be returned to their original negative side. Accordingly, the signs of the real parts of the complex image signals can be used to determine whether the polarities of the signals have been inverted or not. However, in a case where the phases of the image signals have been shifted, it is difficult to correctly determine the signs and the original polarities of the image signals.

With this consideration, the fitting part 41A is configured to calculate the phase $\varphi$ of a stable image signal obtained when the signal intensity has been recovered fully through the T1 relaxation. For example, any image signal whose intensity becomes higher than a threshold Th can be subjected to the calculation of the phase $\varphi$. Incidentally, in order to improve the accuracy of calculation of the phase $\varphi$, it is desired that the image signal obtained responsively to the longest TI be an object for the calculation of the phase $\varphi$.

The fitting part 41A is also configured to correct the phases of the image signals using the calculated phase $\varphi$. Practically, the image signal obtained every TI is multiplied by $\exp(-j\varphi)$, whereby an image signal whose phase has been corrected is obtained. Next, image signal values whose real parts represent negative signs after the phase correction are plotted in the negative side area of the graph. This provides discrete corrected data $I_{cor}$ which can be plotted by dotted line markings in FIG. 9, where the polarities of the plotted data $I_{cor}$ are corrected. As a result, there are provided discrete data with no singular point, which consist of the corrected plotted data $I_{cor}$ whose polarities are inverted and the plotted data $I_{abs}$ whose polarities are not inverted. This discrete data can be obtained as a plurality of image signals whose polarities have been corrected.

Next, the discrete data is subjected to the curve fitting by the method of least squares using a recovery curve whose parameter is a T1 value. Thereby, an expression defining an image signal recovery curve $I_{curve}$, which is continuous data, is calculated from the discrete data. In addition, a T1 value corresponding to a time constant of the image signal recovery curve $I_{curve}$ is obtained as a result of the curve fitting.

Note that, a TI when a value of the image signal recovery curve $I_{curve}$ is zero is the optimum value $TI_{opt}$ for IR imaging.

The above-mentioned method including the curve fitting shown in FIG. 9 performs a phase correction of complex image signals corresponding to MR signals acquired by performing a data acquisition multiple times with changing a period from application timing of an IR pulse to acquisition timing of MR signals, and performs the curve fitting using image signals obtained by a polarity correction of absolute-value image signals after the phase correction. However, the curve fitting may be performed using a discontinuous curve corresponding to absolute-value image signals. In this case, the phase correction processing and the polarity inversion processing are not required though a calculating expression becomes complicated.

Alternatively, curve fitting can also be simply performed using the absolute-value image signals, without performing the phase correction processing.

Figure 10:
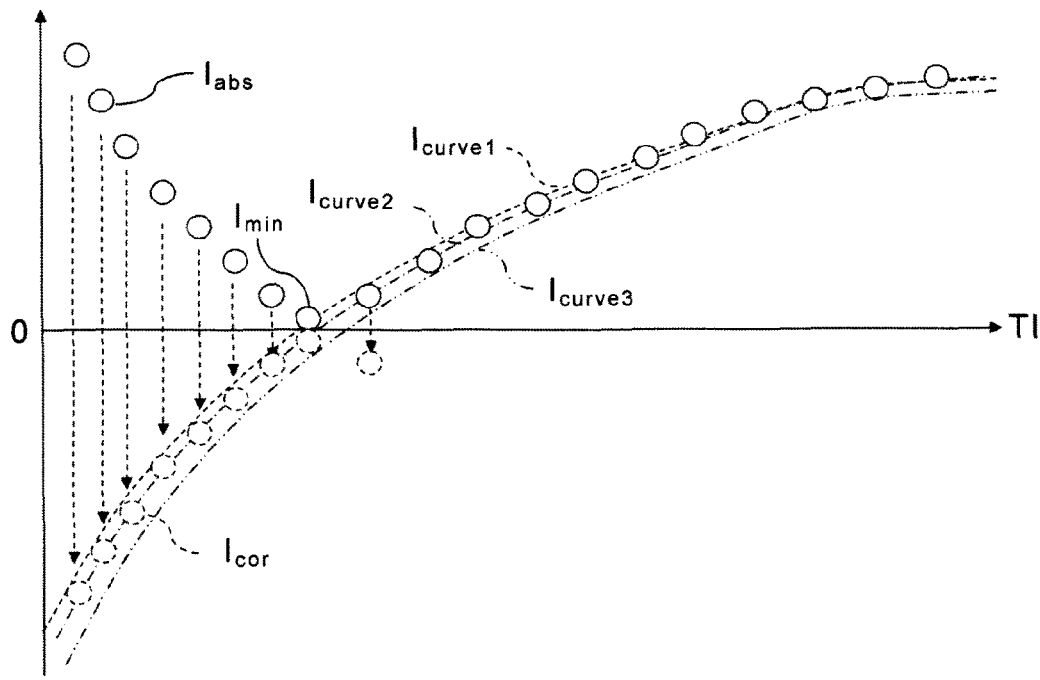
FIG. 10 shows another example of curve obtained by curve fitting.

FIG. 10 shows another example of curve obtained by curve fitting.

In FIG. 10, the vertical axis shows intensities of image signals and the horizontal axis shows TIs of IR pulses applied for acquiring the image signals. As described above, discrete plotted data $I_{abs}$ as shown by solid line markings are obtained by plotting absolute values of complex image signals at each pixel position.

Next, the minimum value $I_{min}$ of the discrete plotted data $I_{abs}$ is obtained. All of the polarities of absolute-value plotted data $I_{abs}$ whose each TI value is shorter than a TI providing the minimum value $I_{min}$ are turned to the negative side, before the curve fitting by the method of least squares. This curve fitting calculation can provide an expression defining the first image signal recovery curve $I_{curve1}$ which is continuous data as shown by the dotted line.

Next, the polarity of the minimum value $I_{min}$ is turned to the negative side, and the curve fitting is performed under the method of least squares. This curve fitting calculation can provide an expression defining the second image signal recovery curve $I_{curve2}$ which is also continuous data as shown by the dashed-dotted line.

Of the first and second image signal recovery curves $I_{curve1}$ and $I_{curve2}$, either one curve whose degree of curve-fitted approximation is better than that of the other is chosen as a result of the curve fitting. For example, an index indicating the degree of curve-fitted approximation can be an error sum of squares between the discrete data and the recovery curve. Concretely, either the first or second image signal recovery curve $I_{curve1}$ or $I_{curve2}$, which produces a smaller error sum of squares between the curve and the discrete data used to obtain the curve, is decided as an image signal recovery curve $I_{curve}$ to calculate the $TI_{opt}$ for imaging.

In this way, the first image signal recovery curve $I_{curve1}$ can be obtained through the curve fitting performed on the first plural image signals obtained by inverting the respective polarities of the absolute-value image signals acquired responsively to TIs which are each shorter than the TI corresponding to the minimum value $I_{min}$ of the plurality of absolute-value image signals acquired based on the plurality of TIs. Meanwhile the second image signal recovery curve $I_{curve2}$ can be obtained through the curve fitting performed on the second plural image signals obtained by inverting both the polarity of the absolute-value image signal acquired responsively to the minimum value $I_{min}$ and the polarities of the absolute-value image signals acquired responsively to the TIs which are each shorter than the TI corresponding to the minimum value $I_{min}$. Then, either one of the curves, of which the degree of approximation of the curve fitting is superior to that of the other, can be adopted. This adoption makes it possible to easily calculate the image signal recovery curve $I_{curve}$ and a T1 corresponding to the image signal recovery curve $I_{curve}$.

In addition, the polarity of absolute-value plotted data $I_{abs}$ adjacent to the minimum value $I_{min}$ among the discrete plotted data $I_{abs}$ and corresponding to the longer TI may be inverted before the curve fitting. In this case, an expression defining the third image signal recovery curve $I_{curve3}$ shown by the dashed-two dotted line in FIG. 10 is calculated as continuous data. Then, among the first, second and third image signal recovery lines $I_{curve1}$, $I_{curve2}$ and $I_{curve3}$, an image signal recovery curve which is best with regard to the degree of approximation of the curve fitting is adopted as a result of the curve fitting. Obtaining the third image signal recovery line $I_{curve3}$ allows the processing to be robust even if data fluctuates due to some causes such as beat.

That is, the method shown in FIG. 9 determines the discrete data of the absolute values, which should be inverted to negative values, by a phase correction since the true minimum value of the image signal recovery curve $I_{curve}$ is unknown. By contrast, the method shown in FIG. 10 determines the discrete data of the absolute values, which should be inverted to negative values, by comparing the error of the curve fitting, in the case where the minimum value of the discrete data, which is near the true minimum value, and/or discrete data adjacent to the minimum value are inverted, with that in the case where the minimum value of the discrete data and/or the discrete data adjacent to the minimum value are not inverted.

According to the method shown in FIG. 10, a reliable signal recovery curve and a T1 corresponding to the signal recovery curve can be obtained without complex phase correction processing. Moreover, when the third image signal recovery curve $I_{curve3}$ is not calculated in the method shown in FIG. 10, the data processing can be simplified more.

On the other hand, the curve fitting can also be performed using not absolute values of complex image signals but real part signals. In that case, the fitting part 41A calculates a phase φ of a complex image signal whose T1 has been recovered fully. Then, the phases of the complex image signals corresponding to all TIs are corrected using the calculated phase φ of the complex image signal. As a result of this phase correction, image signals whose imaginary part signals are zero and only real part signals having values can be obtained. Thereby, it becomes possible to perform the curve fitting using the real part signals of the image signals after the phase correction.

An ROI which is a target region of the curve fitting can also be previously set, with referring to desired reference image data, before acquiring MR signals which are a target of the curve fitting. In such a case, it is not necessarily required to display a reference image for setting an ROI based on image signals which are a target of the curve fitting. Therefore, when an ROI to be a target region of the curve fitting has been previously set or when all pixel positions are a target region of the curve fitting, the curve fitting using real part signals of image signals has efficacy from a viewpoint of simplification of processing.

Furthermore, when an ROI to be a target region of the curve fitting is set before acquiring MR signals which are a target of the curve fitting, the curve fitting can also be performed using MR signals acquired with a local excitation of the ROI. In that case, the fitting part 41A calculates a phase φ of a complex MR signal whose T1 has been recovered fully. Then, phases of complex MR signals corresponding to all TIs are corrected using the calculated phase φ of the complex MR signal. As a result of this phase correction, MR signals whose imaginary part signals are zero and only real part signals having values can be obtained. Thereby, it becomes possible to perform the curve fitting using the real part signals of the phase-corrected MR signals acquired by the local excitation.

While the curve fitting described with reference to FIG. 9 or FIG. 10 is an example of acquiring image signals with application of IR pulses, a similar curve fitting can be performed also in case of acquiring image signals with application of SAT pulses. When MR signals and image signals are acquired with application of SAT pulses, real parts of complex MR signals and complex image signals have positive values regardless of time phases. Therefore, a polarity correction of absolute-value image signals after the phase correction is unnecessary.

As described above, MR signals acquired by a local excitation or image signals can be subjected to a phase correction. Then, the curve fitting can be performed using real part signals of the phase-corrected MR signals acquired by the local excitation, absolute value image signals after the phase correction, or real part signals of the image signals after the phase correction. In other words, the phase correction of MR signals or image signals, which are a target of the curve fitting, and the necessary polarity inversion processing are performed before the curve fitting.

Expression (1) can be used for the curve fitting based on signals acquired with the application of IR pulses.

$$f_{IR}(t)=A_{IR}\{1-2\exp(-t/T_1)\} \quad (1)$$

wherein, $f_{IR}(t)$ represents a function showing the curve, $A_{IR}$ represents an absolute value of the longitudinal magnetization immediately after an application of each IR pulse, t represents the time or the time phase, and $T_1$ represents a T1 which is a time constant, respectively.

However, when an IR pulse is repeatedly applied as shown in FIG. 4 or FIG. 7, the longitudinal magnetization does not often recover completely, immediately before applications of the second and subsequent IR pulses. In that case, each of the initial longitudinal magnetizations immediately after the applications of the second and subsequent IR pulses is strictly smaller than the initial longitudinal magnetization immediately after the application of the first IR pulse. It can be considered that a decreasing amount in the initial longitudinal magnetization immediately after an application of each IR pulse becomes larger as the length of the interval $T_{RR}$ between adjacent R-waves is shorter.

Thus, the curve fitting using e.g., expression (2) leads to improvement in accuracy because decreasing in the initial longitudinal magnetization resulting from a short length of the interval $T_{RR}$ between adjacent R-waves is considered.

$$f_{IR}(t)=A_{IR}\{1-2\exp(-t/T_1)+\exp(-T_{RR}/T_1)\} \quad (2)$$

wherein, $f_{IR}(t)$ represents a function showing the curve, $A_{IR}$ represents an absolute value of the longitudinal magnetization immediately after an application of each IR pulse, t represents the time or the time phase, $T_1$ represents a T1 which is a time constant, and $T_{RR}$ represents an interval between adjacent R-waves, respectively.

Furthermore, an inversion efficiency of the longitudinal magnetization by applying an IR pulse is not strictly 100%. Specifically, when an IR pulse is applied, the longitudinal magnetization inclines by an angle which is obtained by multiplying 180 degrees by an inversion efficiency. Therefore, the initial longitudinal magnetization decreases depending on the inversion efficiency of IR pulse. Thus, performing the curve fitting using e.g., expression (3) leads to further improvement in accuracy because decreasing in the initial longitudinal magnetization resulting from the inversion efficiency of IR pulse is considered.

$$f_{IR}(t)=A_{IR}\{1-2\exp(-t/T_1)+B_{IR}\exp(-T_{RR}/T_1)\} \quad (3)$$

wherein, $f_{IR}(t)$ represents a function showing the curve, $A_{IR}$ represents an absolute value of the longitudinal magnetization immediately after an application of each IR pulse, t represents the time or the time phase, $T_1$ represents T1 which is a time constant, $B_{IR}$ represents an inversion efficiency of IR pulse, and $T_{RR}$ represents an interval between adjacent R-waves, respectively.

That is, the curve fitting can be performed using an expression including the second parameter $B_{IR}$ showing an inversion efficiency of IR pulse in addition to the first parameter $A_{IR}$ showing the initial longitudinal magnetization, besides the T1. Expression (2) corresponds to a case where the value of the second parameter $B_{IR}$ in expression (3) is 1. When the curve fitting is performed using expression (3), the T1 can be calculated with a higher accuracy.

Note that, the interval $T_{RR}$ between adjacent R-waves can be previously obtained as an average value of the intervals $T_{RR}$ of R-waves detected from an ECG signal obtained by the ECG unit 38. Empirically, measuring the interval $T_{RR}$ between adjacent R-waves about 20 times to calculate an average value can obtain a typical value of the interval $T_{RR}$ between adjacent R-waves.

Before the data acquisition of MR signals which is a target of the curve fitting, applying an IR pulse a predetermined number of times for reducing a fluctuation in a recovery amount of the longitudinal magnetization in the intervals $T_{RR}$ between adjacent R-waves of an ECG signal leads to stabilization of the recovery amount of the longitudinal magnetization. Therefore, the predetermined number of IR pulse applications can be set before an imaging sequence in the IR pulse setting part 40A, the sequence setting part 40C and the timing setting part 40D.

On the other hand, expression (4) can be used for the curve fitting based on signals acquired with application of SAT pulses.

$$f_{SAT}(t)=A_{SAT}\{1-\exp(-t/T_1)\} \quad (4)$$

wherein, $f_{SAT}(t)$ represents a function showing the curve, $A_{SAT}$ represents an asymptotic value by a recovery of the longitudinal magnetization after an application of each SAT pulse, t represents the time or the time phase, and $T_1$ represents a T1 which is a time constant, respectively.

The SAT pulse also has a saturation efficiency. Specifically, when a SAT pulse is applied, the longitudinal magnetization becomes not strictly zero but a value according to a saturation efficiency. Therefore, the initial longitudinal magnetization changes depending on a saturation efficiency of SAT pulse. Thus, performing the curve fitting using e.g., expression (5) leads to further improvement in accuracy because a change in the initial longitudinal magnetization resulting from the saturation efficiency of SAT pulse is considered.

$$f_{SAT}(t)=A_{SAT}\{1-B_{SAT}\exp(-t/T_1)\} \quad (5)$$

wherein, $f_{SAT}(t)$ represents a function showing the curve, $A_{SAT}$ represents an asymptotic value by a recovery of the longitudinal magnetization after an application of each SAT pulse, $B_{SAT}$ represents a saturation efficiency of SAT pulse, t represents the time or the time phase, $T_1$ represents a T1 which is a time constant, respectively. That is, the curve fitting can be performed using an expression including the second parameter $B_{SAT}$ showing a saturation efficiency of SAT pulse in addition to the first parameter $A_{SAT}$ showing an asymptotic value of the longitudinal magnetization, besides the T1. Expression (4) corresponds to a case where the value of the second parameter $B_{SAT}$ in expression (5) is 1. When the curve fitting is performed using expression (5), the T1 can be calculated with a higher accuracy.

Note that, expressions of the curve fitting based on signals acquired with application of IR pulses or SAT pulses are not only limited to the above-mentioned expressions but also include various variations. For example, expression (6) can be used instead of expression (1) as an expression of the curve fitting based on signals acquired with application of IR pulses. Furthermore, expression (7), expression (8), expression (9) or expression (10) can be used instead of expression (2) or expression (3).

$$f_{IR}(t)=A_1-B_1\exp(-t/T_1^*) \quad (6)$$

$$f_{IR}(t)=A_1-B_1\exp(-t/T_1^*)+\exp(-T_{RR}/T_1^*) \quad (7)$$

$$f_{IR}(t)=A_1\{1-B_1\exp(-t/T_1^*)+\exp(-T_{RR}/T_1^*)\} \quad (8)$$

$$f_{IR}(t)=A_1\{1-B_1\exp(-t/T_1)\}+\exp(-T_{RR}/T_1) \quad (9)$$

$$f_{IR}(t)=A_1-B_1\exp(-t/T_1)+C_1\exp(-T_{RR}/T_1) \quad (10)$$

wherein, $T_1^*$ is a time constant which satisfies expression (11), and each of $A_1$, $B_1$ and $C_1$ is a coefficient obtained by the fitting.

$$T_1=T_1^*(B_1/A_1-1) \quad (11)$$

Expressions from expression (6) to expression (10) correspond to fitting expressions whose arbitrariness are improved by multiplying terms of the exponential functions included in expression (1), expression (2) and expression (3) by coefficients, respectively.

Similarly, various variations are considered as expressions of the curve fitting based on signals acquired with application of SAT pulses. For example, a correction can be performed by expression (12) using a length of the interval $T_{RR}$ between adjacent R-waves as a parameter.

$$f_{SAT}(t)=A_2\{1-\exp(-t/T_1)\}+B_2\exp(-T_{RR}/T_1) \quad (12)$$

As described above, the curve fitting can be performed using an expression for compensating an incomplete inversion of the longitudinal magnetization resulting from an inversion efficiency of IR pulse or an expression for compensating an incomplete saturation of the longitudinal magnetization resulting from a saturation efficiency of SAT pulse. In addition, since an application interval of IR pulses or SAT pulses changes caused by a change in period of an ECG signal, the curve fitting can also be performed using an expression for correcting a variation in the longitudinal magnetization, immediately after an application of each IR pulse or each SAT pulse, resulting from a degree of the longitudinal magnetization which recovers according to the application intervals of the IR pulses or the SAT pulses.

Note that, since the longitudinal magnetization becomes zero immediately after an application of a SAT pulse, an error of the curve fitting resulting from an incomplete recovery of the longitudinal magnetization can be reduced when SAT pulses are applied as the prepulses. Therefore, reduction in accuracy of the curve fitting due to a fluctuation of the interval $T_{RR}$ between R-waves and the like can be avoided. Meanwhile, when IR pulses are applied as the prepulses, plotted points used for the curve fitting exist not only in the positive side but in the negative side. Therefore, a curve can be stably obtained by the curve fitting.

It is also important to secure the sufficient sampling number of MR signals in order to stably obtain a curve with high accuracy by the curve fitting. However, when recovery of the longitudinal magnetization is slow, it may be difficult to perform the curve fitting with high precision using only MR signals acquired in the interval $T_{RR}$ between adjacent R-waves. Thus, a data acquisition may be performed for each continuous heart rates of an ECG signal.

Figure 11:
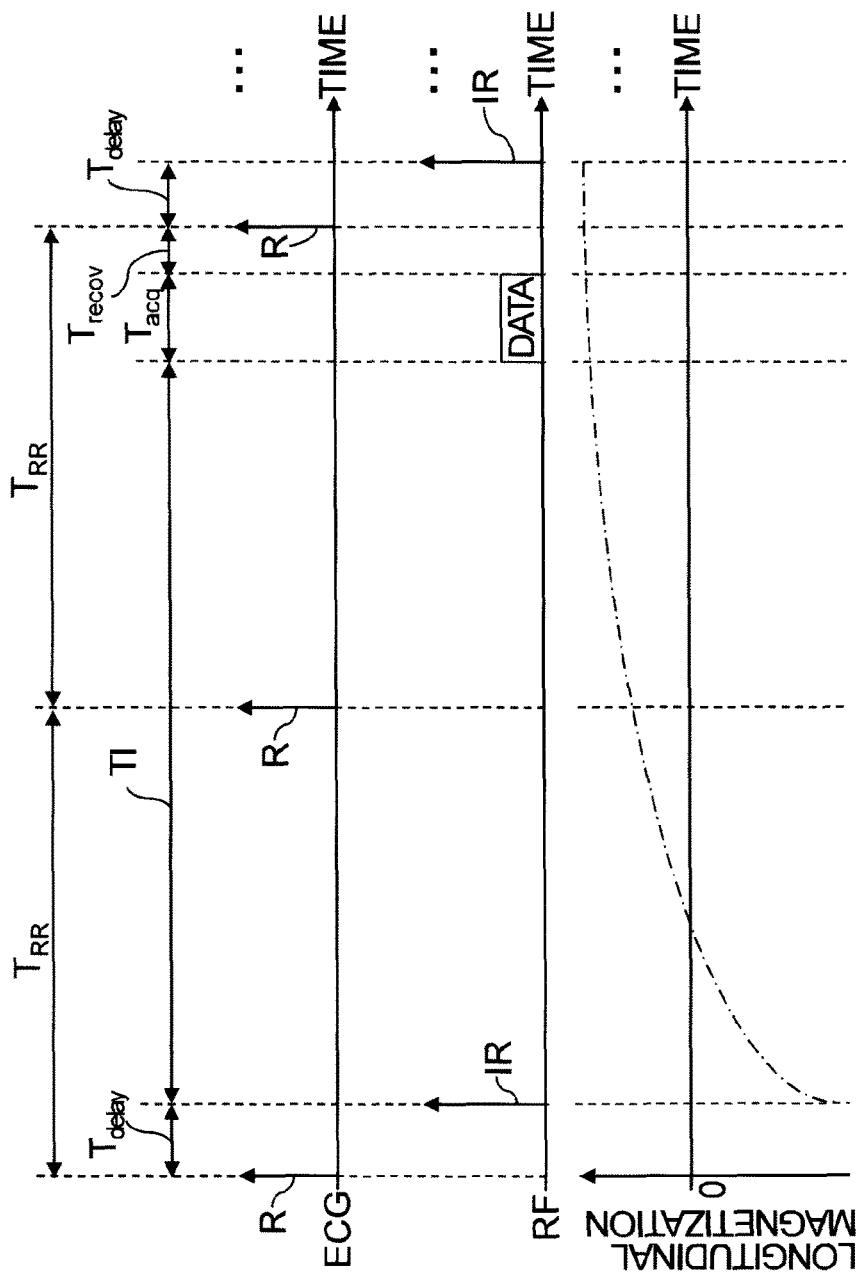
FIG. 11 is a sequence chart showing data acquiring conditions in case of acquiring data within continuous two heart beats.

FIG. 11 is a sequence chart showing data acquiring conditions in case of acquiring data within continuous two heart rates.

In FIG. 11, each horizontal axis shows time, ECG shows detection timing of each R-wave of an ECG signal, RF shows application timing of each IR pulse and data acquisition timings of MR signals, and the lowermost graph shows a time change of the longitudinal magnetization, respectively.

When the recovery time is long as the T1 relaxation curve indicated by the dashed-dotted line on the graph in FIG. 11, an application of an IR pulse and an acquisition of MR signals can be performed in two intervals (2RR) between R-waves. In other words, a variable setting range of TI of IR pulse can be set longer than the interval $T_{RR}$ between adjacent R-waves. Thereby, sufficient sampling points according to a T1 value can be secured for the curve fitting. Note that, considering a breath-holding period, it is realistic to set the variable setting range of TI within two heart beats ($2T_{RR}$).

Figure 12:
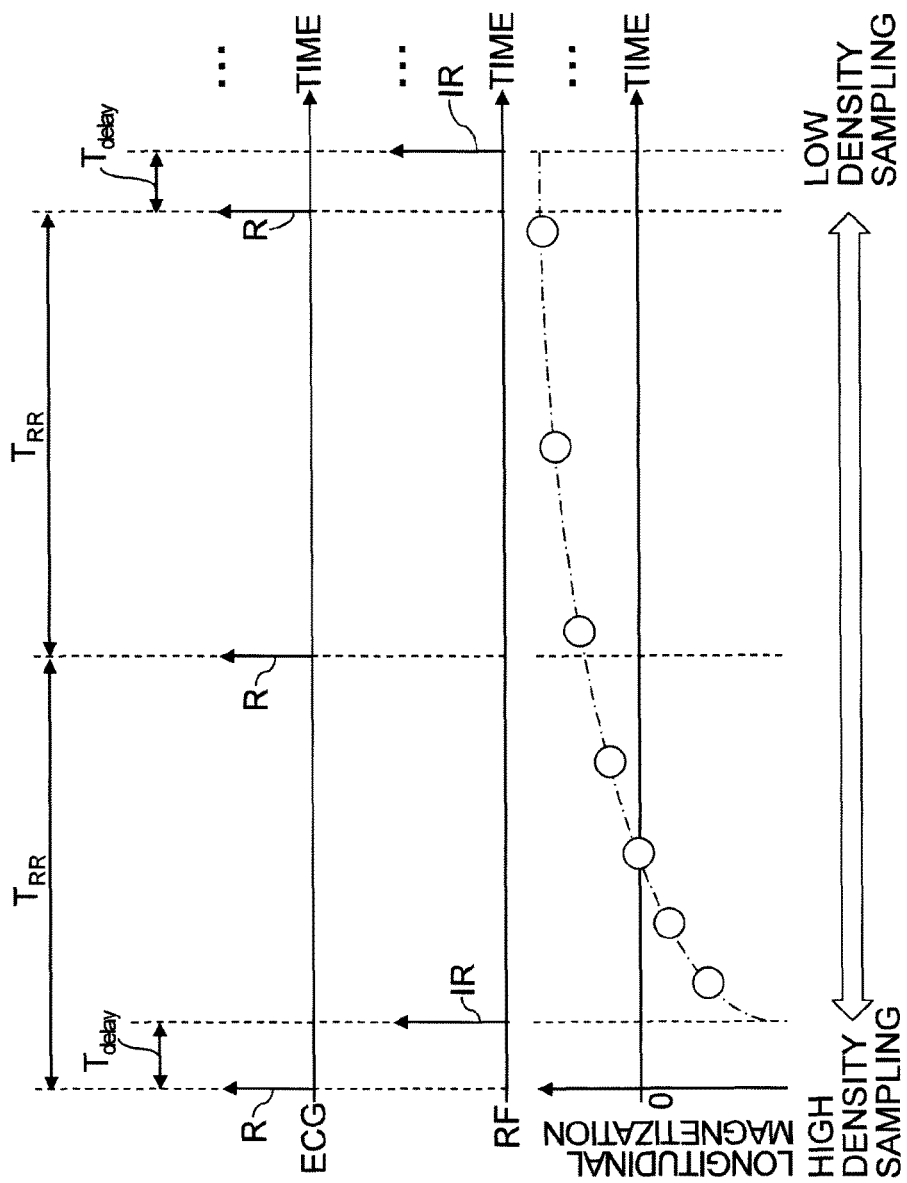
FIG. 12 shows an example where sampling intervals of MR signals for curve fitting are unequal.

FIG. 12 shows an example where sampling intervals of MR signals for curve fitting are unequal.

In FIG. 12, each horizontal axis shows time, ECG shows detection timing of each R-wave of an ECG signal, RF shows application timing of each IR pulse, and the lowermost graph shows a time change of the longitudinal magnetization and sampling points of MR signals, respectively.

The T1 relaxation curve is expressed by an exponential function as mentioned above. Therefore, an amount of change in the longitudinal magnetization decreases gradually. Thus, when sampling intervals of MR signals for the curve fitting are unequal, the sampling number of data can be reduced with securing an accuracy of the curve fitting. Specifically, data acquiring conditions can be set so that a data acquisition is performed multiple times with changing a period from application timing of an IR pulse to acquisition timing of MR signals, and the longer the period from the application timing of the IR pulse to the acquisition timing of the MR signals is, the longer an interval of change in the period is.

The sampling intervals of MR signals for the curve fitting, i.e., intervals of the change in the period from the application timing of an IR pulse to the acquisition timing of MR signals can be set according to an imaging target. Appropriate sampling intervals of MR signals are intervals according to substances which are an imaging target. Thus, the appropriate sampling intervals can be set according to an imaging part, such as the heart or the abdomen, or tissues which are an imaging target, such as normal myocardial tissues or abnormal myocardial tissues.

The sampling intervals of MR signals may be manually designated by an operation of the input circuit 33, or may be preset so as to be selected at the time of a data acquisition by previously determining appropriate sampling intervals for each imaging target. That is, sampling interval sets appropriate for respective imaging targets can be stored as a table in the storage circuit 36. The sampling intervals may be set so that sampling intervals become unequal between MR signal trains each consisting of MR signals, instead of setting all the sampling intervals of MR signals to be unequal. In that case, sampling intervals are set to become long in incremental steps.

The data acquisition over plural heart beats shown in FIG. 11 and the data acquisition with variable sampling intervals shown in FIG. 12 can be similarly performed when a SAT pulse is used as a prepulse. Although each of the examples shown in FIG. 11 and FIG. 12 show a case where each delay time $T_{delay}$ from an R-wave to application timing of an IR pulse is constant similarly to the example shown in FIG. 3, data acquisition time phases may be constant with variable delay times $T_{delay}$ as shown in FIG. 6. Note that, when the data acquisition time phases are constant, data acquisition timings are at a same cardiac time phase and a period from application timing of an IR pulse to data acquisition timing changes.

The application timings of prepulses and acquisition timings of MR signals as shown in FIG. 11 and FIG. 12 can also be set in the timing setting part 40D. Therefore, the timing setting part 40D also has a function as an interval setting part configured to set intervals of a change in a period from application timing of an IR pulse to acquisition timing of MR signals, according to an imaging target.

The T1 distribution image generation part 41B has a function to generate T1 distribution image data whose pixel values are T1s at respective pixel positions calculated by the curve fitting. That is, the T1 distribution image generation part 41B has a function to generate T1 distribution image data by mapping T1 data on respective pixel positions. The generated T1 distribution image data can be displayed on the display 34 as MR image data for diagnosis. A T1 distribution image displayed as a T1 map is effective to be displayed in color using a color scale corresponding to T1 values. Referring to a T1 distribution image allows visual confirmation of an infarction part as a part whose T1 values are small.

The inversion/saturation efficiency compensation part 41C has a function to compensate an error resulting from an inversion efficiency of IR pulse or a saturation efficiency of SAT pulse as mentioned above. When time constant data, such as T1 data, are obtained by the curve fitting, the compensation of an error resulting from an inversion efficiency of IR pulse or a saturation efficiency of SAT pulse can be performed by setting a coefficient or coefficients corresponding to the inversion efficiency of IR pulse or the saturation efficiency of SAT pulse as mentioned above. That is, the compensated time constant data can be obtained by the curve fitting using an expression for compensating the inversion efficiency of IR pulse or the saturation efficiency of SAT pulse.

When MR image data, such as T1 distribution image data, are generated as MR examination data, the MR image data whose contrast has been adjusted can be generated by using pixel values obtained based on an expression or expressions including an inversion efficiency of IR pulse or a saturation efficiency of SAT pulse as a parameter. For example, when T1 distribution image data are generated, the compensated T1 distribution image data can be generated by filling each pixel value with T1 data at each pixel position obtained based on a fitting expression for compensating an incomplete inversion of the longitudinal magnetization resulting from an inversion efficiency of IR pulse. Alternatively, when MR morphological image data at a certain specific time phase are generated, what is necessary is to use an expression including an inversion efficiency of IR pulse or a saturation efficiency of SAT pulse as a parameter, in order to obtain image signals at respective pixel positions at the time phase.

As described above, MR examination data based on MR signals can be generated by data processing including processing for compensating an incomplete inversion of the longitudinal magnetization resulting from an inversion efficiency of IR pulse or processing for compensating an incomplete saturation of the longitudinal magnetization resulting from a saturation efficiency of SAT pulse. Specifically, as the processing for compensating an incomplete inversion of the longitudinal magnetization resulting from an inversion efficiency of IR pulse or the processing for compensating an incomplete saturation of the longitudinal magnetization resulting from a saturation efficiency of SAT pulse, processing for adjusting a contrast can be performed. Thereby, compensated MR image data can be generated as MR examination data.

Alternatively, the curve fitting can be performed using an expression for compensating an incomplete inversion of the longitudinal magnetization resulting from an inversion efficiency of IR pulse or an expression for compensating an incomplete saturation of the longitudinal magnetization resulting from a saturation efficiency of SAT pulse. Thereby, compensated time constant data can be generated as MR examination data. Note that, time constant distribution image data generated using the compensated time constant data at pixel positions become compensated MR image data whose contrast has been adjusted.

The TI decision part 41D has a function to determine a TI for IR imaging based on a curve at each pixel position calculated by the curve fitting. Specifically, the TI corresponding to a period from application timing of an IR pulse, at which a value of a curve obtained by the curve fitting becomes zero, to acquisition timing of MR signals can be set as a TI for blood flow imaging of the heart by the IR method. The set TI for IR imaging is notified from the TI decision part 41D to the timing setting part 40D. Then, the timing setting part 40D sets the TI determined by the TI decision part 41D as an imaging parameter for blood flow imaging of the heart by the IR method.

When MR signals corresponding to different TIs are acquired by applying an IR pulse with changing a TI, and subsequently, IR imaging is separately performed by setting an appropriate TI, a scan which acquires the MR signals corresponding to the different TIs also serves as a pre-scan for determining the appropriate TI for the IR imaging.

The appropriate TI for IR imaging is one typical value set for an imaging region by the IR method. On the other hand, curves at many pixel positions are obtained by the curve fitting. Therefore, a single or plural pixel positions are determined for selecting a curve or curves used for determining a TI for IR imaging.

The single or plural pixel positions for determining a TI for IR imaging can be designated as at least one ROI, using arbitrary reference image data. When a ROI or ROIs for determining a TI for IR imaging are set after acquiring MR signals for each TI for the curve fitting, the ROI or ROIs for determining the TI for the IR imaging can be set using MR image data, corresponding to an arbitrary TI, as the reference image data.

Figure 13:
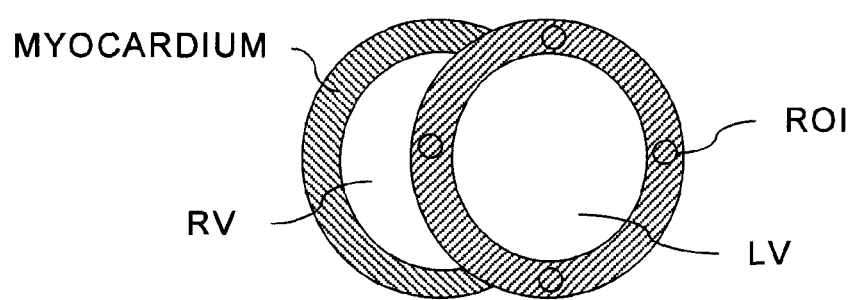
FIG. 13 shows an example of setting ROIs for determining a TI for an IR imaging.

FIG. 13 shows an example of setting ROIs for determining a TI for an IR imaging.

As shown in FIG. 13, short axis image data of the heart corresponding to a certain TI can be used as the reference image data. A short axis section of the heart provides a structure having the LV (left ventricle) and the RV (right ventricle) both sectioned by the myocardium.

A user can refers to a short axis image of the heart displayed on the display 34 and manipulate the input circuit 33 to place a single or plural ROIs at a desired position or desired positions on the section image of the myocardium. In order to obtain the optimal TI for IR imaging scan with a sufficient accuracy, it is desired to raise the number of the ROIs. FIG. 13 shows an example in which four ROIs are placed.

When plural pixel positions are included in the set ROI, a TI when a value of a curve at a pixel position, such as an average, representing the pixel positions becomes zero can be calculated. Meanwhile, when a ROI has been set as a point, a TI when a value of a curve at a corresponding pixel position becomes zero can be calculated.

When plural ROIs have been set as exemplified in FIG. 13, it is necessary to determine a TI for an IR imaging scan based on TIs corresponding to the ROIs. For example, an average value of the plural TIs corresponding to the plural ROIs can be determined as the TI for the IR imaging scan.

It is known that artifacts appear as black lines on the myocardium when DE (Delayed Enhancement) imaging is performed with a TI shorter than a TI corresponding to a zero-crossing point of a curve corresponding to the myocardium tissue. Accordingly, in case of DE imaging, the longest TI among plural TIs corresponding to plural ROIs may be determined as the TI for an IR imaging scan. Thereby, artifacts due to a TI whose length is insufficient can be suppressed.

The IR image generation part 41E has a function to generate IR image data based on MR signals acquired by applying an IR pulse with a TI set in the imaging condition setting part 40. Examples of the IR image data include non-contrast blood flow image data besides DE image data. When the DE image data are generated, a contrast agent is injected into the object P before an IR imaging scan. Note that, the DE image data using gadolinium as the contrast agent is also called LGE (Late Gadolinium Enhancement) image data.

The display processing part 41F has a function to perform necessary display processing of examination information, such as image data, obtained in each element of the data processing part 41 and display the processed examination information on the display 34.

Figure 14:
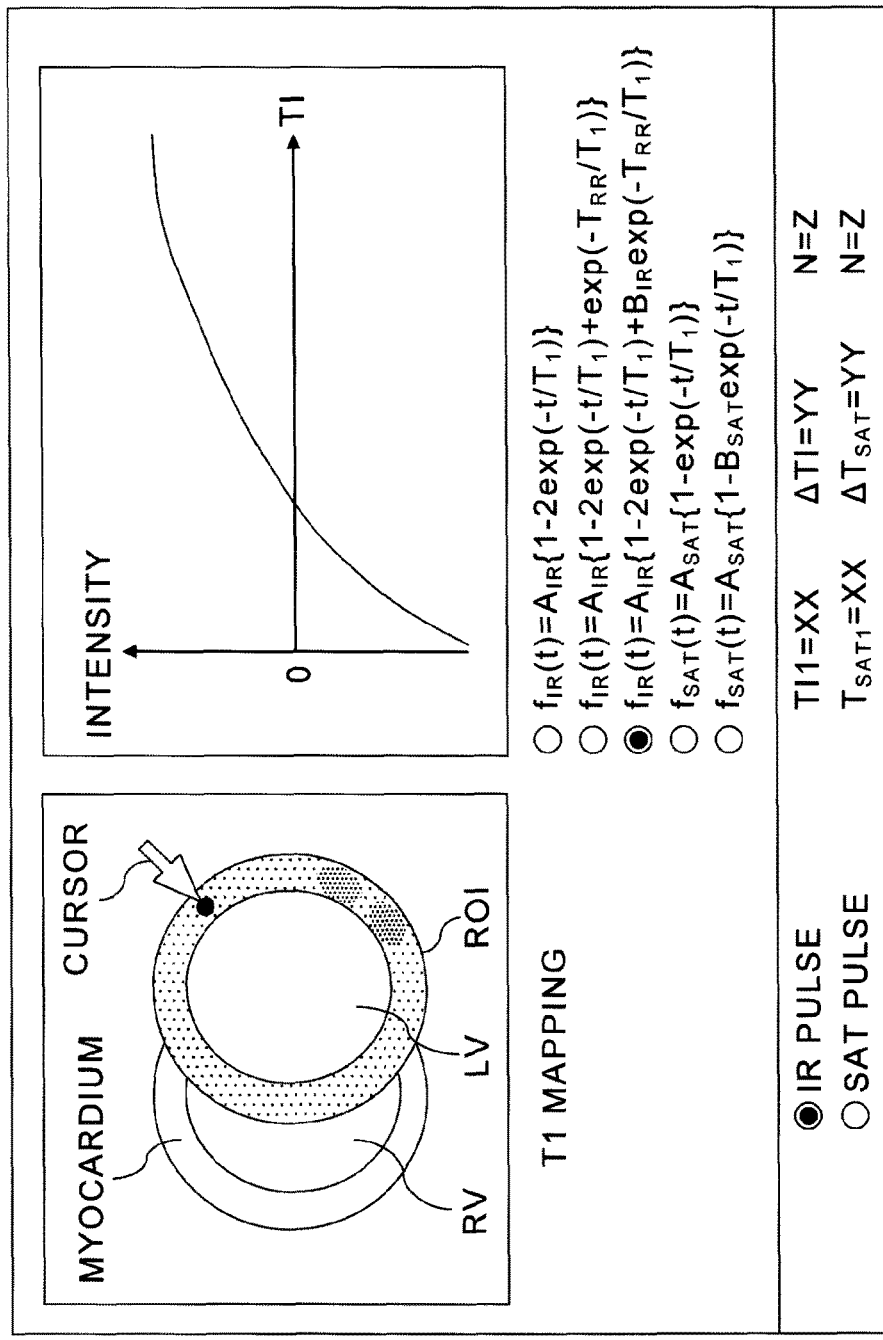
FIG. 14 shows an example of displaying a T1 distribution image.

FIG. 14 shows an example of displaying a T1 distribution image.

As shown in FIG. 14, a ROI including a section of the myocardium can be set automatically by contour extraction processing or manually by operating the input circuit 33. In the example shown in FIG. 14, a myocardial section forming the LV among myocardial sections forming the RV and the LV is set as the ROI. Note that, an IR image acquired in a certain TI can be used as an MR image for setting the ROI.

Then, T1 distribution image data of the ROI generated by obtaining time constants of curves at pixel positions in the ROI including the myocardium can be displayed on the display 34. When a pixel position in the ROI has been designated by an operation of the input circuit 33, a curve for obtaining a T1 at the designated pixel position can also be displayed on the display 34. In the example shown in FIG. 14, a recovery curve of the longitudinal magnetization, after an application of an IR pulse, corresponding to the pixel position designated by the cursor has been displayed. Therefore, it can be visually recognized easily whether the T1 has been calculated based on a stable curve.

As shown in FIG. 14, it is also possible to allow selecting an expression used for the curve fitting for obtaining the T1s. By such a GUI (graphical user interface), the curve fitting can be performed in accuracy according to the stability of curves used for the curve fitting. Furthermore, a T1 distribution can also be easily recalculated. In the example shown in FIG. 14, expression (3) used for the curve fitting when IR pulses are applied has been selected.

The display 34 can also display corresponding imaging conditions and/or a setting screen of imaging conditions in addition to a data analysis result as mentioned above. The imaging conditions can be output from the imaging condition setting part 40 to the display 34. In the example shown in FIG. 14, the radio buttons for selecting an IR pulse or a SAT pulse as a prepulse, and the columns for setting the initial value TI1 of the TI or the initial value $T_{SAT1}$ of the period $T_{SAT}$, the variation $\Delta TI$ of the TI or the variation $\Delta T_{SAT}$ of the period $T_{SAT}$, and the increment number N of the TI variation $\Delta TI$ or the variation $\Delta T_{SAT}$ of the period $T_{SAT}$ have been displayed.

Next, an operation and action of the magnetic resonance imaging apparatus 20 will be described. An example of case where an IR pulse is applied as a prepulse will be described here.

Figure 15:
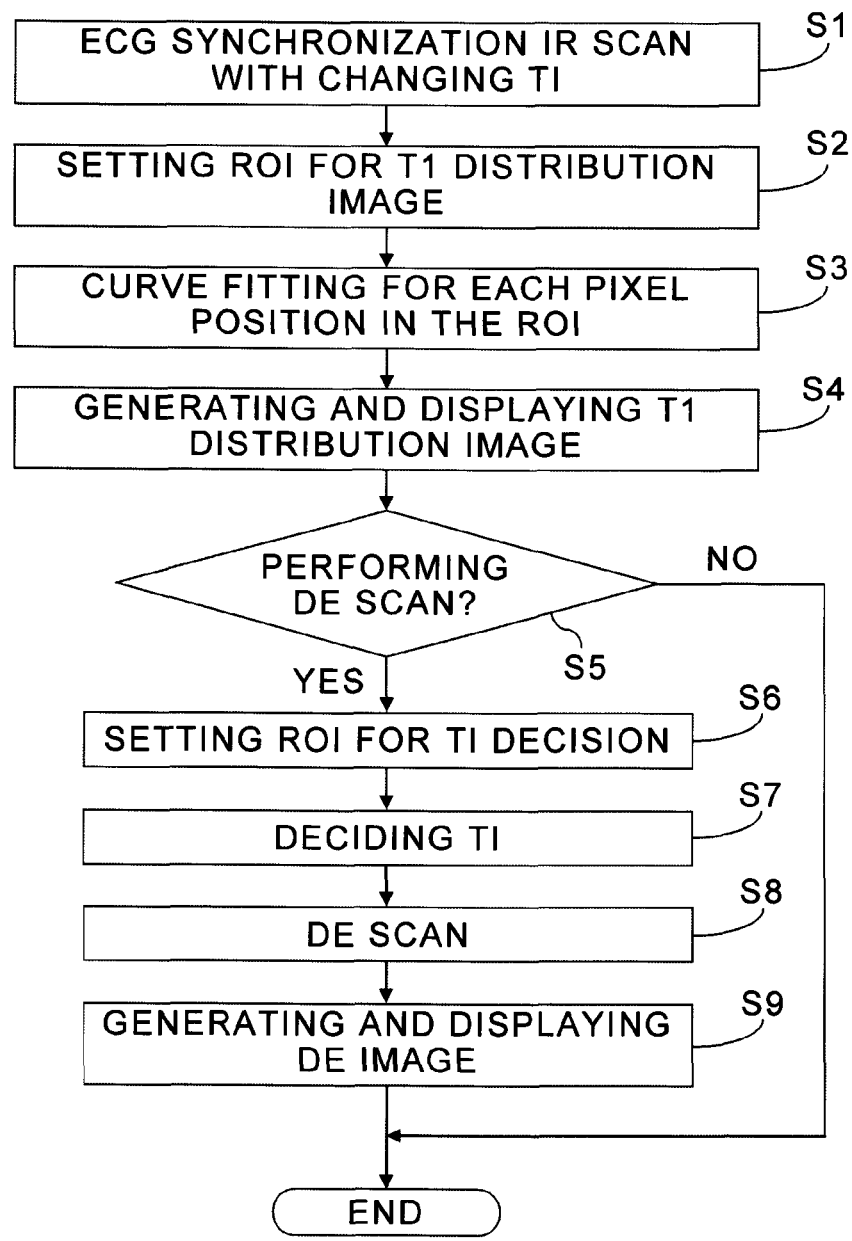
FIG. 15 is a flow chart showing an example of operation of the magnetic resonance imaging apparatus shown in FIG. 1.

FIG. 15 is a flow chart showing an example of operation of the magnetic resonance imaging apparatus 20 shown in FIG. 1.

An object P is first set on the bed 37 in advance, and the static magnetic field power supply 26 is activated to drive the static field magnet 21 (i.e., superconductive magnet) such that a static magnetic field is produced in an imaging region of the static field magnet 21. The shim coil 22 is also driven by current from the shim coil power supply 28 so that the static magnetic field produced in the imaging region becomes uniform.

Next, in step S1, an imaging scan which repeatedly applies an IR pulse with changing a TI in synchronization with an ECG signal is performed. More specifically, the imaging condition setting part 40 sets an IR sequence, as exemplified from FIG. 3 to FIG. 8, as data acquiring conditions. In addition, the sampling condition shown in FIG. 11 and the sampling condition shown in FIG. 12 may also be set.

Then, the imaging condition setting part 40 outputs the imaging conditions including the IR sequence to the sequence controller 31. The sequence controller 31 activates the gradient power supply 27, the transmitter 29, and the receiver 30 according to the imaging conditions, resulting in the production of gradient magnetic fields in the imaging region, in which the object P is located, and the generation of RF signals from the RF coils 24.

Hence, MR signals caused by the magnetic resonance within the object P are received by the RF coils 24 and then sent to the receiver 30. The receiver 30 receives the MR signals from the RF coils 24 to produce digital-format raw data from the MR signals. The receiver 30 provides the sequence controller 31 with the produced MR data, and, in response to this, the sequence controller 31 outputs the MR data to the data processing unit 41. As a result, the data processing unit 41 maps, as k-space data, the MR data in the k-space virtually formed in the k-space data storage circuit 42.

Accordingly, the k-space data storage circuit 42 stores k-space data sets corresponding to different plural TIs.

Next, in step S2, an ROI which is a generation target of T1 distribution image data is set. For that purpose, the IR image generation part 41E applies image reconstruction processing including an FT of the k-space data set corresponding to a designated TI. Thereby, reference image data where a morphology on a myocardial section or the like has been depicted are generated for setting the ROI.

Then, the fitting part 41A automatically sets a region, such as a myocardial section, which is automatically extracted by contour extraction processing based on the reference image data, as the ROI. Alternatively, the ROI may also be set manually by operating the input circuit 33 with referring to the reference image data. Note that, the entire imaging region may also be a generation target of the T1 distribution image data without setting the ROI. In other words, the entire imaging region may be set as the ROI which is a generation target of the T1 distribution image data.

Next, in step S3, the fitting part 41A performs the curve fitting based on image signals corresponding to the plural TIs at each pixel position in the ROI. For the curve fitting when image signals are acquired with applying IR pulses, expression (1), expression (2), expression (3) or the like can be used. As a result, T1s can be obtained as time constants of curves at the pixel positions in the ROI.

Especially, when the curve fitting is performed using an expression including an inversion efficiency of IR pulse as a parameter, T1s in which an influence of an incomplete inversion of the longitudinal magnetization resulting from the inversion efficiency of IR pulse has been compensated can be obtained. Further, when the curve fitting is performed using an expression including the interval $T_{RR}$ between adjacent R-waves as a parameter, T1s in which an influence of incomplete recovery of the longitudinal magnetization immediately before an application of each IR pulse has been compensated can be obtained.

Next, in step S4, the T1 distribution image generation part 41B generates T1 distribution image data whose pixel values are the T1s at the pixel positions in the ROI. The T1 distribution image data can also be generated by the color coding using a color scale corresponding to the T1s, besides image data having brightness values corresponding to the T1s. Generating the T1 distribution image data as color image data allows easy observation of a disease part.

The T1 distribution image data generated in the T1 distribution image generation part 41B are displayed on the display 34 as exemplified in FIG. 14. Therefore, a user can diagnose by observing a T1 distribution image of the myocardial tissues displayed on the display 34. The examination can end when the diagnosis can be performed sufficiently by observing the T1 distribution image.

On the other hand, a DE imaging scan of the heart can also be performed subsequently. In that case, an execution direction of the DE imaging scan is input from the input circuit 33 into the imaging condition setting part 40. Therefore, the imaging condition setting part 40 determines that the DE imaging scan is to be performed, in the judgment of step S5.

Then, in step S6, the TI decision part 41D sets a single or plural ROIs for determining a TI which should be set as an imaging parameter for the DE imaging scan. The ROI or ROIs for determining the TI can also be set through arbitrary reference image data, where a section of the myocardium has been depicted as exemplified in FIG. 13. As a specific example, an arbitrary frame of IR image data can be selected, as the reference image data, from the frames of the IR image data corresponding to the plural TIs acquired for generating the T1 distribution image data.

Next, in step S7, the TI decision part 41D calculates a TI when a value of the curve, at a position representing the pixel positions in the ROI, which has been obtained by the curve fitting, becomes zero. When plural ROIs have been set, plural TIs corresponding to the plural ROIs are calculated. In that case, one TI for the DE imaging scan is determined based on the plural TIs. For example, an average value of the plural TIs or the longest TI among the plural TIs can be determined as the TI for the DE imaging scan. Then, the TI determined in the TI decision part 41D is notified to the timing setting part 40D of the imaging condition setting part 40.

Next, in step S8, the DE imaging scan which uses the TI determined in the TI decision part 41D as an imaging parameter is performed in synchronization with an ECG signal. MR signals acquired by the DE imaging scan are arranged as k-space data in a k-space formed in the k-space data storage circuit 42.

Next, in step S9, the IR image generation part 41E generates DE image data by image reconstruction processing based on the k-space data stored in the k-space data storage circuit 42. The generated DE image data are displayed on the display 34. Therefore, a user can diagnose by observing the DE image of the heart in addition to the T1 distribution image.

Note that, although FIG. 15 shows a case where an IR pulse is applied as a prepulse, a SAT pulse can also be applied as a prepulse. Furthermore, at least one of an ROI for generating the T1 distribution image data and at least one ROI for a TI decision may also be set before the IR imaging scan in step S1.

That is, the magnetic resonance imaging apparatus 20 as mentioned above is configured to sequentially acquire time series MR signals, for obtaining T1s by curve fitting, after applications of prepulses which are repeatedly applied in synchronization with an ECG signal, i.e., in different intervals $T_{RR}$ between R-waves, instead of continuously acquiring the time series MR signals after an application of a single prepulse. In addition, the magnetic resonance imaging apparatus 20 is configured to be able to compensate errors by efficiencies of prepulses and/or incomplete recoveries of the longitudinal magnetization immediately before applications of prepulses. Furthermore, the magnetic resonance imaging apparatus 20 is configured to be able to acquire MR signals, which are respectively acquired after applications of prepulses, at cardiac time phases which can be considered as same.

Therefore, according to the magnetic resonance imaging apparatus 20, time series MR signals for curve fitting can be acquired under appropriate conditions. Consequently, more stable curves can be obtained with a higher accuracy. Thereby, a T1 distribution image of the heart can be obtained with a more satisfactory accuracy. Furthermore, an appropriate TI for an IR delayed enhancement imaging can also be obtained with a high precision.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   MRI system components including a static field magnet, a gradient coil and at least one radio frequency coil, said MRI system components being configured to effect an MRI pulse sequence which applies an inversion recovery pulse or a saturation pulse and thereafter acquires a magnetic resonance signal; and a processing circuit configured to generate magnetic resonance examination data based on the acquired magnetic resonance signal by (a) data processing including curve fitting based on an expression which provides compensation for incomplete inversion of longitudinal magnetization resulting from less than perfect inversion efficiency of the inversion recovery pulse or (b) data processing including curve fitting based on an expression which provides compensation for incomplete saturation of longitudinal magnetization resulting from less than perfect saturation efficiency of the saturation pulse.

2. A magnetic resonance imaging apparatus of claim 1, wherein said static field magnet, said gradient coil and said at least one radio frequency coil are configured to perform a data acquisition of the magnetic resonance signal after applying the inversion recovery pulse or the saturation pulse in synchronization with a biological signal, the data acquisition being performed multiple times with a changing period from an application timing of the inversion recovery pulse or the saturation pulse to an acquisition timing of the magnetic resonance signal, a variation in the period becoming longer as the period becomes longer.

3. A magnetic resonance imaging apparatus of claim 1, wherein said processing circuit is configured to generate magnetic resonance image data as the magnetic resonance examination data by performing processing which adjusts contrast as the processing for compensating the incomplete inversion of the longitudinal magnetization or the processing for compensating the incomplete saturation of the longitudinal magnetization.

4. A magnetic resonance imaging apparatus of claim 1, wherein said static field magnet, said gradient coil and said at least one radio frequency coil are configured to perform a data acquisition of the magnetic resonance signal after applying the inversion recovery pulse or the saturation pulse in synchronization with a biological signal, the data acquisition being performed multiple times with a changing period from an application timing of the inversion recovery pulse or the saturation pulse to an acquisition timing of the magnetic resonance signal, and said processing circuit is configured to generate time constant data by curve fitting based on magnetic resonance signals acquired by performing the data acquisition multiple times or image signals corresponding to the magnetic resonance signals, the curve fitting using an expression which compensates for incomplete inversion of longitudinal magnetization resulting from less than perfect inversion efficiency of the inversion recovery pulse or an expression which compensates for incomplete saturation of the longitudinal magnetization resulting from less than perfect saturation efficiency of the saturation pulse.

5. A magnetic resonance imaging apparatus of claim 4, wherein said processing circuit is configured to generate longitudinal relaxation time distribution image data by obtaining the time constant of the curve for each pixel position.

6. A magnetic resonance imaging apparatus of claim 4, wherein said processing circuit is configured to perform the curve fitting using an expression which corrects for a change in the longitudinal magnetization after applying the inversion recovery pulse or the saturation pulse, the change resulting from a degree of the longitudinal magnetization which has recovered according to an application interval of the inversion recovery pulse or the saturation pulse.

7. A magnetic resonance imaging apparatus of claim 4, wherein said processing circuit is configured to perform a phase correction of the magnetic resonance signals acquired by local excitations or the image signals, and perform the curve fitting using real part signals of the magnetic resonance signals, after the phase correction, acquired by the local excitations or real part signals of the image signals after the phase correction.

8. A magnetic resonance imaging apparatus of claim 4, wherein said processing circuit is configured to perform a phase correction of the image signals corresponding to the magnetic resonance signals, and perform the curve fitting using image signals obtained by a polarity correction of absolute value image signals after the phase correction.

9. A magnetic resonance imaging apparatus of claim 2, wherein said processing circuit is configured to set the variation in the period according to an imaging target.

10. A magnetic resonance imaging apparatus of claim 2, wherein said static field magnet, said gradient coil and said at least one radio frequency coil are configured to perform the data acquisition for each of plural successive heart beats of an electro cardiogram signal.

11. A magnetic resonance imaging apparatus of claim 2, wherein said static field magnet, said gradient coil and said at least one radio frequency coil are configured to acquire the magnetic resonance signals at predetermined cardiac time phases, which can be considered to be same, by changing a delay time from a reference wave of an electro cardiogram signal to the inversion recovery pulse or the saturation pulse, the delay time being changed for each data acquisition.

12. A magnetic resonance imaging (MRI) apparatus comprising:

MRI system components including a static field magnet, a gradient coil and at least one radio frequency coil, said MRI system components being configured to perform a magnetic resonance data signal acquisition multiple times, the data signal acquisition acquiring a magnetic resonance signal after applying an inversion recovery pulse or a saturation pulse in synchronization with a biological signal, a time period from (a) application of the inversion recovery pulse or the saturation pulse to (b) acquisition of the magnetic resonance signal varying for different magnetic resonance data signal acquisitions, a variation in the period becoming longer as the period becomes longer; and a processing circuit configured to generate magnetic resonance examination data using curve fitting based on an expression which provides compensation for (a) incomplete inversion of longitudinal magnetization or (b) incomplete saturation of longitudinal magnetization based on magnetic resonance signals acquired by performing the data acquisition multiple times.

13. A magnetic resonance imaging apparatus of claim 12, wherein said static field magnet, said gradient coil and said at least one radio frequency coil are configured to perform a data acquisition of the magnetic resonance signal after applying the inversion recovery pulse or the saturation pulse in synchronization with a biological signal, the data acquisition being performed multiple times with a changing period from an application timing of the inversion recovery pulse or the saturation pulse to an acquisition timing of the magnetic resonance signal, and said processing circuit is configured to generate time constant data by curve fitting based on magnetic resonance signals acquired by performing the data acquisition multiple times or image signals corresponding to the magnetic resonance signals, the curve fitting using an expression which compensates for incomplete inversion of the longitudinal magnetization resulting from less than perfect inversion efficiency of the inversion recovery pulse or an expression which compensates for incomplete saturation of the longitudinal magnetization resulting from less than perfect saturation efficiency of the saturation pulse.

14. A magnetic resonance imaging apparatus of claim 13, wherein said processing circuit is configured to generate longitudinal relaxation time distribution image data by obtaining the time constant of the curve for each pixel position.

15. A magnetic resonance imaging apparatus of claim 13, wherein said processing circuit is configured to perform the curve fitting using an expression which corrects for a change in the longitudinal magnetization after applying the inversion recovery pulse or the saturation pulse, the change resulting from a degree to which the longitudinal magnetization which has recovered according to an application interval of the inversion recovery pulse or the saturation pulse.

16. A magnetic resonance imaging apparatus of claim 12, wherein said processing circuit is configured to set the variation in the period according to an imaging target.

17. A magnetic resonance imaging apparatus of claim 12, wherein said static field magnet, said gradient coil and said at least one radio frequency coil are configured to perform the data acquisition for each of plural successive heart beats of an electro cardiogram signal.

18. A magnetic resonance imaging apparatus of claim 12, wherein said static field magnet, said gradient coil and said at least one radio frequency coil are configured to acquire the magnetic resonance signals at predetermined cardiac time phases, which can be considered to be same, by changing a delay time from a reference wave of an electro cardiogram signal to the inversion recovery pulse or the saturation pulse, the delay time being changed for each data acquisition.

19. A magnetic resonance imaging (MRI) method comprising:

performing an MRI pulse sequence to acquire a magnetic resonance signal after applying an inversion recovery pulse or a saturation pulse; and generating magnetic resonance examination data based on the magnetic resonance signal (a) by data processing including curve fitting based on an expression which provides compensation for incomplete inversion of a longitudinal magnetization resulting from less than perfect inversion efficiency of the inversion recovery pulse or (b) data processing including curve fitting based on an expression which provides compensation for incomplete saturation of a longitudinal magnetization resulting from less than perfect saturation efficiency of the saturation pulse.

* * * * *